US012696615B2

(12) United States Patent
Ko et al.

(10) Patent No.: US 12,696,615 B2
(45) Date of Patent: Jul. 28, 2026

(54) LIGHT-EMITTING DEVICE WITH ELECTRON TRANSPORTING PARTICLE AND ELECTRONIC APPARATUS INCLUDING THE SAME

(71) Applicant: Samsung Display Co., Ltd., Yongin-si (KR)

(72) Inventors: Yunhyuk Ko, Yongin-si (KR); Changhee Lee, Yongin-si (KR); Yunku Jung, Yongin-si (KR); Changyeol Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 735 days.

(21) Appl. No.: 18/070,310

(22) Filed: Nov. 28, 2022

(65) Prior Publication Data

US 2023/0180504 A1 Jun. 8, 2023

(30) Foreign Application Priority Data

Dec. 2, 2021 (KR) ........................ 10-2021-0171201

(51) Int. Cl.
*H10K 50/16* (2023.01)
*H10K 50/115* (2023.01)
*H10K 59/123* (2023.01)

(52) U.S. Cl.
CPC ........... *H10K 50/16* (2023.02); *H10K 50/115* (2023.02); *H10K 59/123* (2023.02)

(58) Field of Classification Search
CPC . H10K 50/16; H10K 50/115; H10K 2102/331
See application file for complete search history.

(56) References Cited

U.S. PATENT DOCUMENTS

2014/0302627 A1* 10/2014 Ko ........................ C09K 11/565 252/301.16
2018/0019371 A1* 1/2018 Steckel ................ C09K 11/883
(Continued)

FOREIGN PATENT DOCUMENTS

CN 113299866 A 8/2021
KR 10-2010-0033090 A 3/2010
(Continued)

OTHER PUBLICATIONS

Zheng et al., "ZnO/ZnS core-shell composites for low-temperature-processed perovskite solar cells", Journal of Energy Chemistry, Sep. 2018, pp. 1461-1467, vol. 27, No. 5, Elsevier.
(Continued)

*Primary Examiner* — Chad M Dicke
*Assistant Examiner* — Jeremy Daniel Watts
(74) *Attorney, Agent, or Firm* — Womble Bond Dickinson (US) LLP

(57) ABSTRACT

A light-emitting device and an electronic apparatus including the light-emitting device. The light-emitting device includes: a first electrode; a second electrode facing the first electrode; and an interlayer between the first electrode and the second electrode, wherein the interlayer may include an emission layer and an electron transport layer, the electron transport layer may be between the emission layer and the second electrode, the electron transport layer may include an electron transporting particle, the electron transporting particle may include a core, a first shell covering the core, and a second shell covering the first shell, the first shell may include a first compound, the second shell may include a second compound, the core may include a third compound, and the first compound and the second compound may each independently include an oxide, a chalcogenide, or any combination thereof.

20 Claims, 2 Drawing Sheets

(56) References Cited

U.S. PATENT DOCUMENTS

| | | | | |
|---|---|---|---|---|
| 2018/0254421 | A1* | 9/2018 | Kinge | H10K 50/15 |
| 2019/0280232 | A1* | 9/2019 | Chang | H10K 50/16 |
| 2020/0067005 | A1 | 2/2020 | Park et al. | |
| 2021/0066634 | A1 | 3/2021 | Park et al. | |
| 2021/0104696 | A1* | 4/2021 | Park | H10K 85/1135 |
| 2021/0126218 | A1 | 4/2021 | Kim et al. | |
| 2021/0257551 | A1* | 8/2021 | Yoon | H10K 85/00 |
| 2021/0269715 | A1 | 9/2021 | Min et al. | |
| 2021/0376278 | A1 | 12/2021 | Lee et al. | |
| 2022/0231242 | A1* | 7/2022 | Yan | H10K 71/12 |
| 2022/0315441 | A1 | 10/2022 | Kim et al. | |
| 2023/0055560 | A1* | 2/2023 | Zampetti | H10K 50/805 |
| 2023/0074734 | A1* | 3/2023 | Won | H10K 50/115 |
| 2023/0094724 | A1* | 3/2023 | Utsumi | H05B 33/26 257/40 |

FOREIGN PATENT DOCUMENTS

| | | | |
|---|---|---|---|
| KR | 10-2020-0021726 | | 3/2020 |
| KR | 10-2021-0027210 | A | 3/2021 |
| KR | 10-2021-0041373 | A | 4/2021 |
| KR | 10-2021-0048786 | | 5/2021 |
| KR | 10-2021-0110232 | A | 9/2021 |
| KR | 10-2021-0149963 | A | 12/2021 |
| KR | 10-2022-0135276 | A | 10/2022 |

OTHER PUBLICATIONS

Musselman et al., "Improved Exciton Dissociation at Semiconducting Polymer:ZnO Donor:Acceptor Interfaces via Nitrogen Doping of ZnO", Advanced Functional Materials, 2014, pp. 3562-3570, vol. 24, Wiley-VCH Verlag Gmbh & Co. KGaA, Weinheim.

* cited by examiner

Attorney: Jun-Young E. Jeon
Docket No.: 219534/411598-06182
Inventor(s): Yunhyuk Ko, et al.
Title: LIGHT-EMITTING DEVICE ...
1/2

LIGHT-EMITTING DEVICE WITH ELECTRON TRANSPORTING PARTICLE AND ELECTRONIC APPARATUS INCLUDING THE SAME

CROSS-REFERENCE TO RELATED APPLICATION

This application claims priority to and the benefit of Korean Patent Application No. 10-2021-0171201, filed on Dec. 2, 2021, in the Korean Intellectual Property Office, the disclosure of which is incorporated by reference herein in its entirety.

BACKGROUND

1. Field

One or more embodiments relate to a light-emitting device and an electronic apparatus including the same.

2. Description of the Related Art

Light-emitting devices are devices that convert electrical energy into light energy. Examples of such light-emitting devices may include organic light-emitting devices in which a light-emitting material is an organic material, and quantum dot light-emitting devices in which the light-emitting material is a quantum dot.

In a light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

SUMMARY

An aspect according to one or more embodiments of the present disclosure is directed toward a light-emitting device including an electron transport layer including an electron transporting particle, the electron transporting particle including a core, a first shell covering the core, and a second shell covering the first shell. Another aspect according to one or more embodiments of the present disclosure is directed toward an electronic apparatus.

Additional aspects will be set forth in part in the description which follows and, in part, will be apparent from the description, or may be learned by practice of the presented embodiments of the disclosure.

According to one or more embodiments, a light-emitting device includes:

a first electrode, a second electrode facing the first electrode, and an interlayer between the first electrode and the second electrode, wherein the interlayer includes an emission layer and an electron transport layer, the electron transport layer is between the emission layer and the second electrode, the electron transport layer includes an electron transporting particle, the electron transporting particle includes a core, a first shell covering the core, and a second shell covering the first shell, the first shell includes a first compound, the second shell includes a second compound, the core includes a third compound, the first compound and the second compound each independently include an oxide, a chalcogenide, or any combination thereof, and the first compound and the second compound are different from each other.

According to one or more embodiments, an electronic apparatus includes the light-emitting device.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
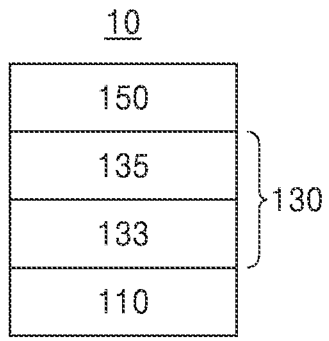
FIG. 1 shows a schematic cross-sectional view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms "first," "second," etc. as used herein may be used herein to describe one or more suitable components, these components should not be limited by these terms. These components are only used to distinguish one component from another.

An expression used in the singular encompasses the expression of the plural, unless it has a clearly different meaning in the context.

The term "consist of" as used herein refers to the existence of only the corresponding component while excluding the possibility that other components are added. For example, the wording "consist of A, B and C" refers to the existence of only A, B and C.

It will be further understood that the terms "includes" and/or "comprises" as used herein may specify the presence of stated features or elements, but do not preclude the presence or addition of one or more other features or elements. Unless defined otherwise, the terms "include or have" may refer to both the case of consisting of features or components described in a specification and the case of further including other components.

The term "B layer on (above) A layer" includes both the case where the A layer and the B layer are in direct contact with each other, and the case where any other layer is located between the A layer and the B layer.

The term "Group II" as used herein may include Group IIA elements and Group IIB elements of the IUPAC periodic table, and the Group II element may include, for example, beryllium (Be), magnesium (Mg), calcium (Ca), strontium (Sr), barium (Ba), zinc (Zn), cadmium (Cd), and mercury (Hg).

The term "Group III" as used herein may include Group IIIA elements and Group IIIB elements of the IUPAC periodic table, and the Group III element may include, for example, scandium (Sc), aluminum (Al), gallium (Ga), indium (In), and thallium (Tl).

The term "Group IV" as used herein may include Group IVA elements and Group IVB elements of the IUPAC periodic table, and the Group IV element may include, for example, titanium (Ti), zirconium (Zr), hafnium (Hf), germanium (Ge), tin (Sn), and lead (Pb).

The term "Group V" as used herein may include Group VA elements and Group VB elements of the IUPAC periodic table, and the Group V element may include, for example, vanadium (V), niobium (Nb), nitrogen (N), phosphorus (P), arsenic (As), and antimony (Sb).

The term "Group VI" as used herein may include Group VIA elements and Group VIB elements of the IUPAC periodic table, and the Group VI element may include, for example, chromium (Cr), molybdenum (Mo), tungsten (W), sulfur (S), selenium (Se), and tellurium (Te).

Hereinafter, an example of the light-emitting device will be described with reference to FIGS. 1 and 2.

Referring to FIG. 1, a light-emitting device 10 includes a first electrode 110, an interlayer 130, and a second electrode 150, and the interlayer 130 includes an emission layer 133 and an electron transport layer 135. The electron transport layer 135 is located between the emission layer 133 and the second electrode 150.

First Electrode 110

In FIG. 1, a substrate may be additionally located under the first electrode 110 or on the second electrode 150. As the substrate, a glass substrate and/or a plastic substrate may be utilized. In one or more embodiments, the substrate may be a flexible substrate, and may include plastics with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer or a multi-layered structure including a plurality of layers. For example, the first electrode 110 may have a three-layered structure of ITO/Ag/ITO.

Hole Transport Region

In some embodiments, the interlayer 130 may additionally include a hole transport region located between the first electrode 110 and the emission layer 133.

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein, in each structure, constituting layers are stacked sequentially from the first electrode 110 in the respective stated order.

The hole transport region may include a compound represented by Formula 201, a compound represented by Formula 202, or any combination thereof:

Formula 201

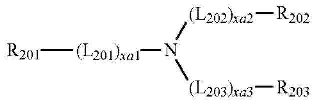

Formula 202

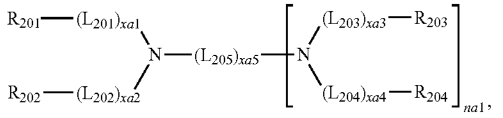

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of the groups represented by Formulae CY201 to CY217.

CY201

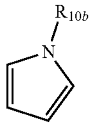

CY202

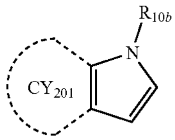

CY203

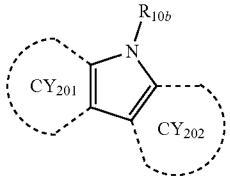

CY204

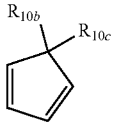

CY205

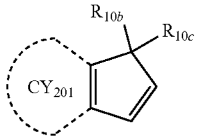

CY206

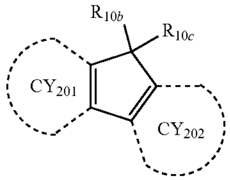

-continued

CY207

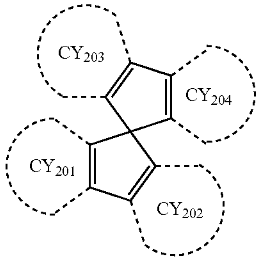

CY208

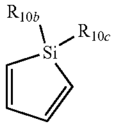

CY209

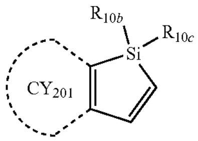

CY210

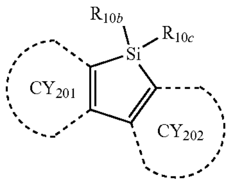

CY211

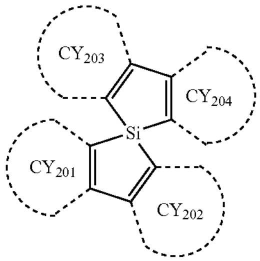

-continued

CY212

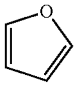

CY213

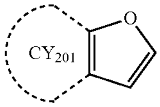

CY214

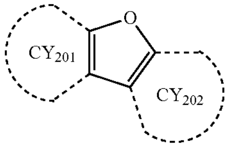

CY215

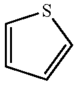

CY216

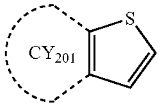

CY217

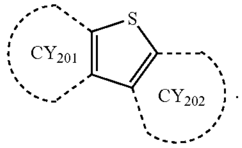

$R_{10b}$ and $R_{10c}$ in Formulae CY201 to CY217 may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring CY201 to ring CY204 in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include (e.g., may exclude) any of the groups represented by Formulae CY201 to CY203.

In one or more embodiments, each of Formulae 201 and 202 may not include (e.g., may exclude) any of the groups represented by Formulae CY201 to CY203, and may include at least one of the groups represented by Formulae CY204 to CY217.

In one or more embodiments, each of Formulae 201 and 202 may not include (e.g., may exclude) any of the groups represented by Formulae CY201 to CY217.

In an embodiment, the hole transport region may include at least one of Compounds HT1 to HT44, m-MTDATA, TDATA, 2-TNATA, NPB(NPD), p-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), poly(9,9-dioctylfluorene-alt-N-(4-sec-butylphenyl)-diphenylamine) (TFB), polyaniline/camphor sulfonic acid (PANI/CSA), polyaniline/poly(4-styrenesulfonate) (PANI/PSS), or any combination thereof:

HT1

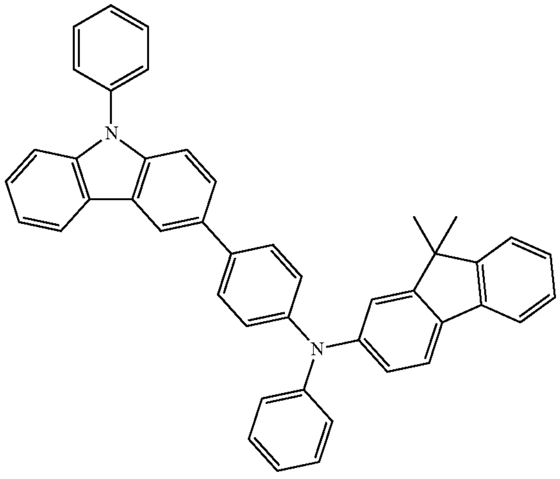

HT2

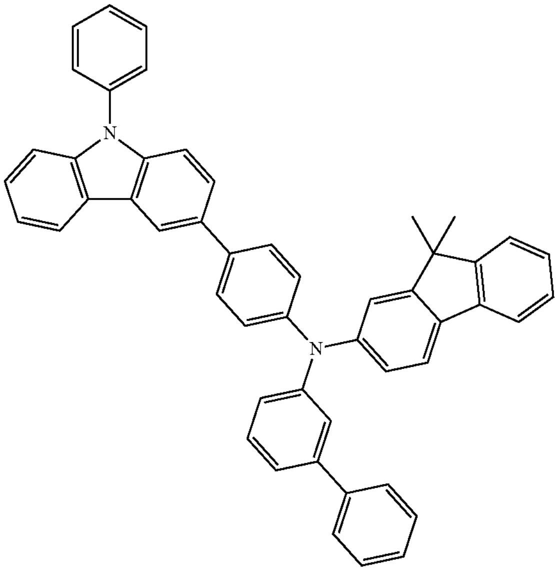

-continued
HT3
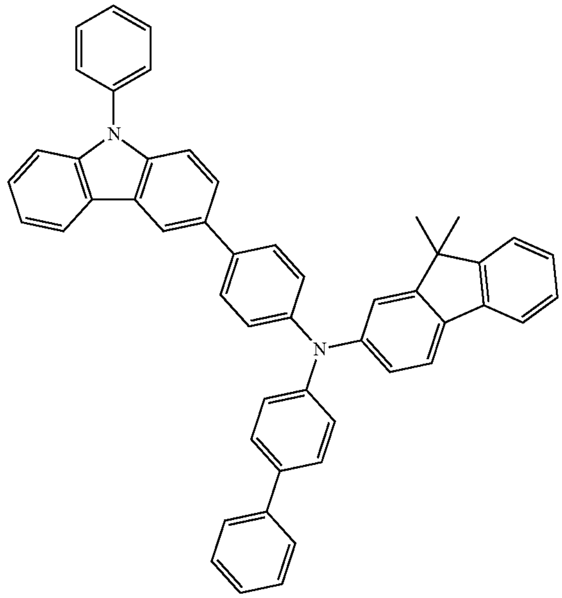
HT4
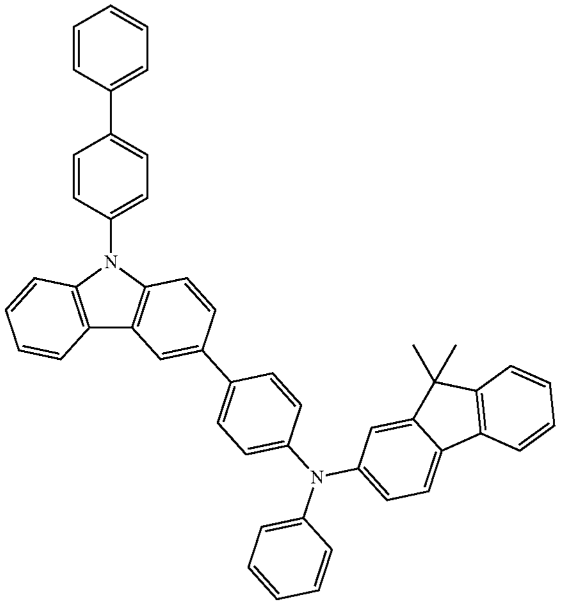
HT5
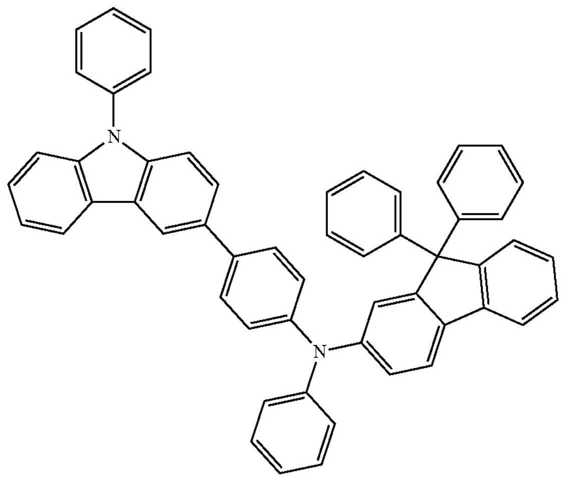
HT6
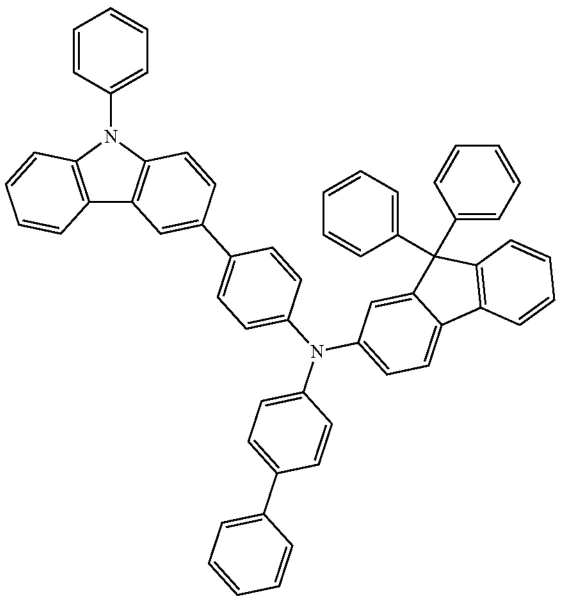

-continued
HT7
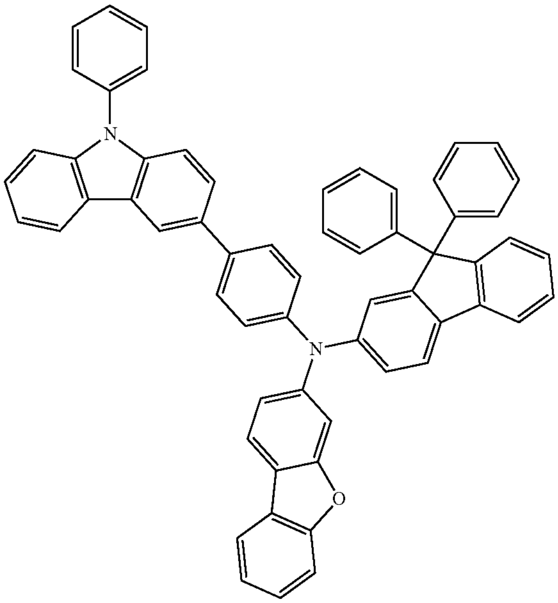
HT8
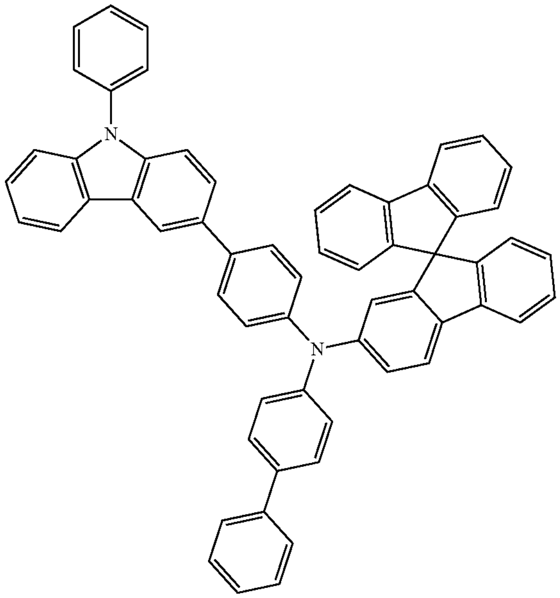
HT9
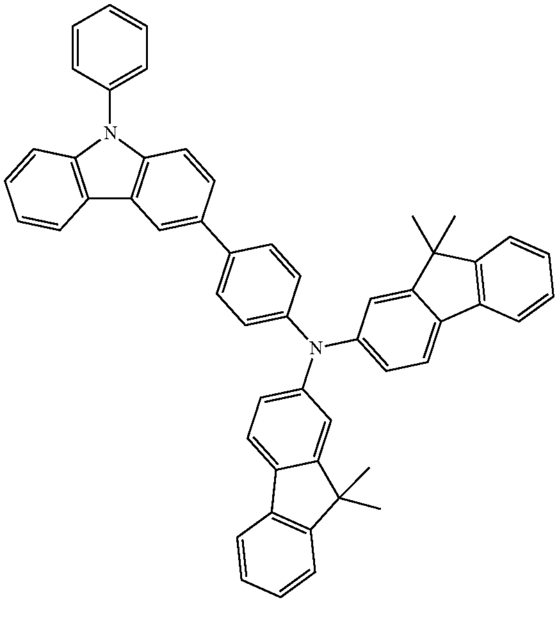
HT10
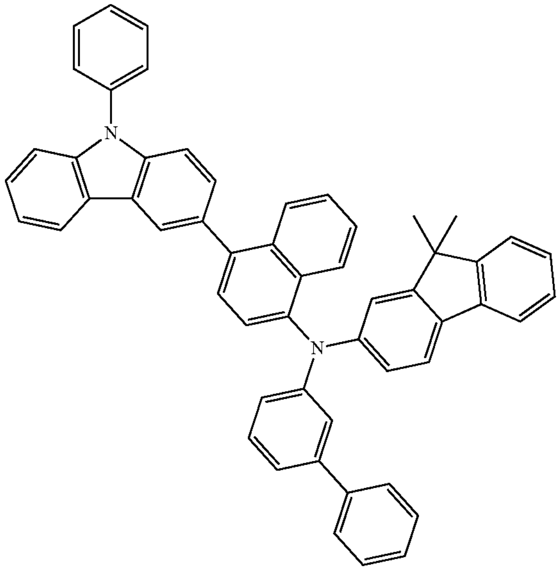

-continued
HT11
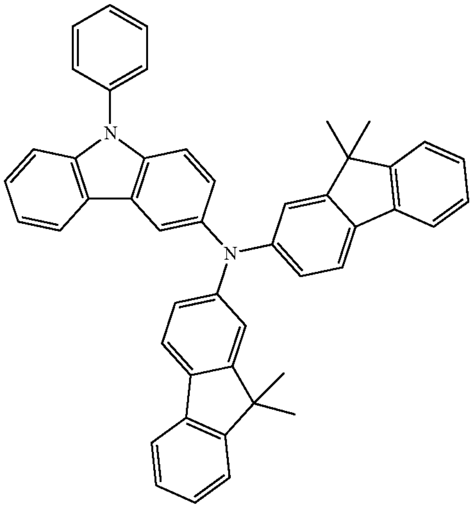
HT12
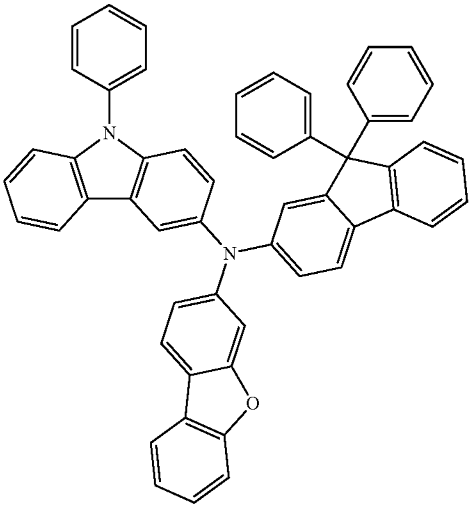
HT13
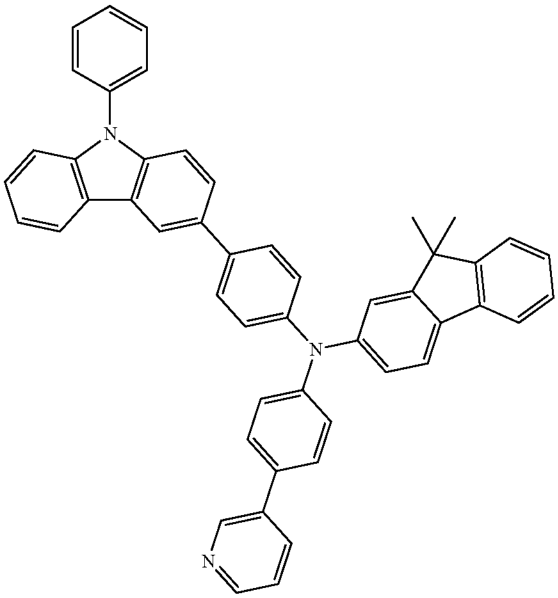
HT14
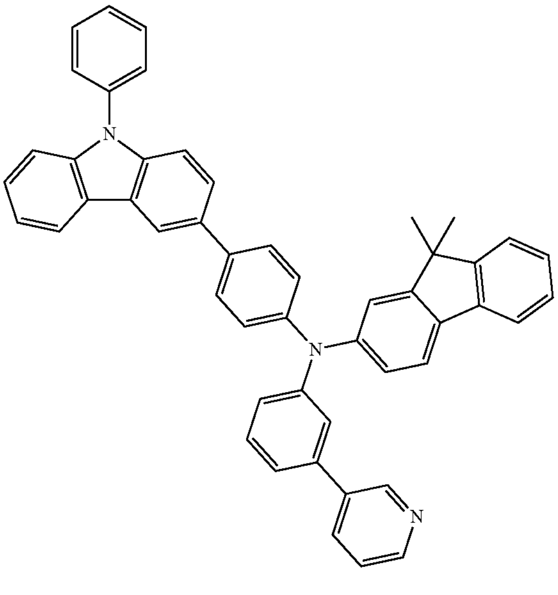
HT15
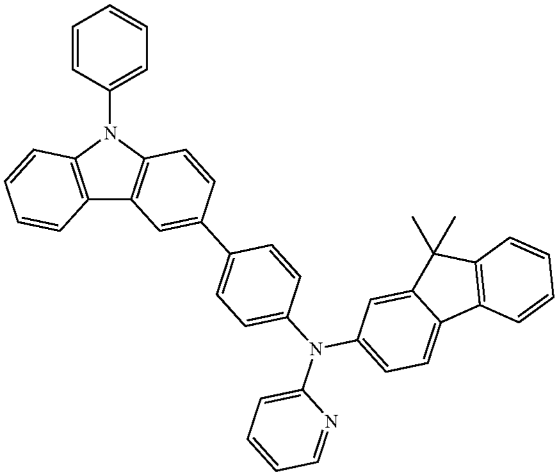
HT16
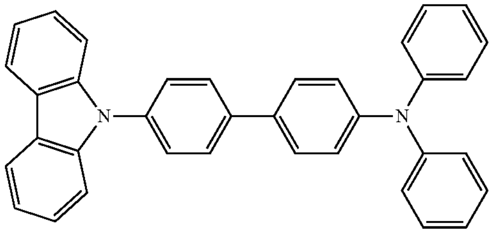

-continued
HT17
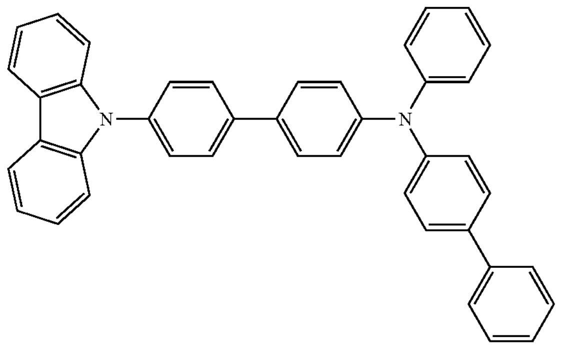
HT18
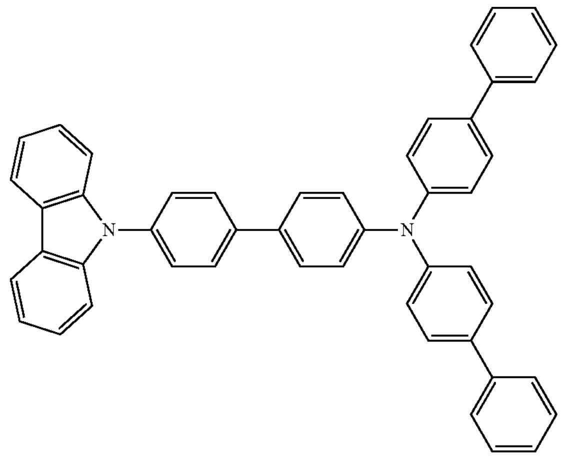
HT19
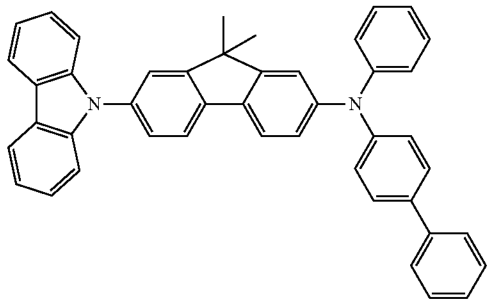
HT20
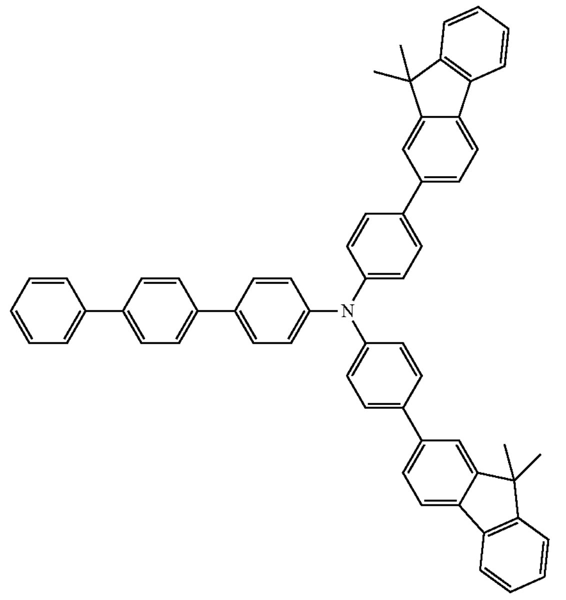
HT21
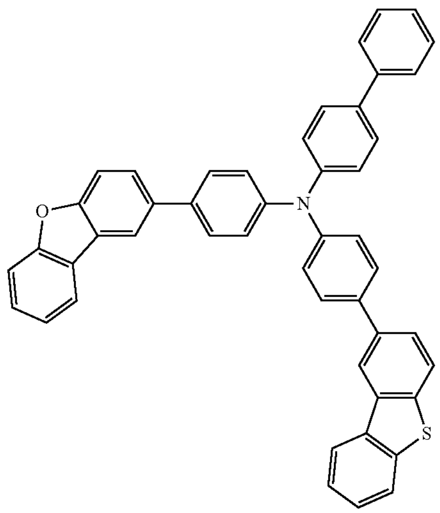
HT22
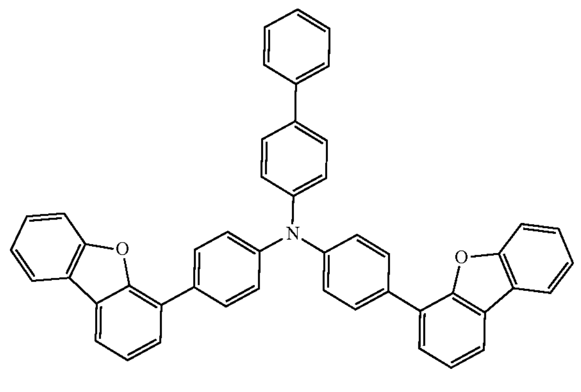

-continued
HT23
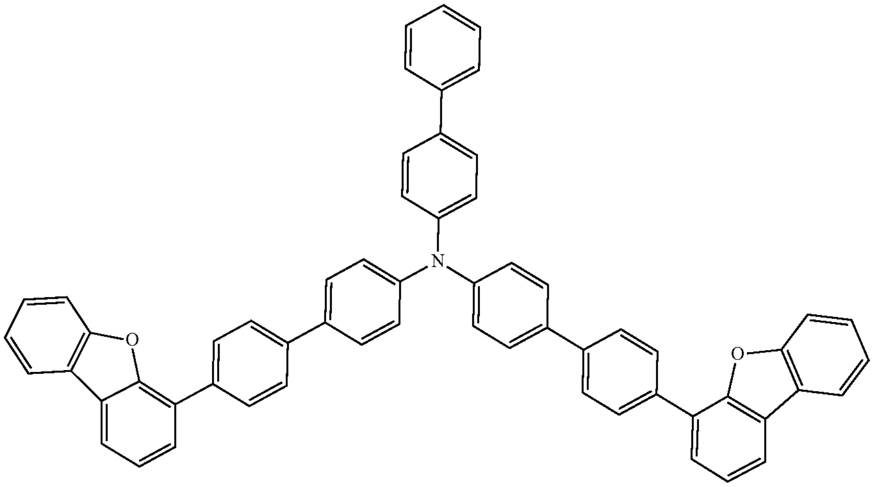
HT24
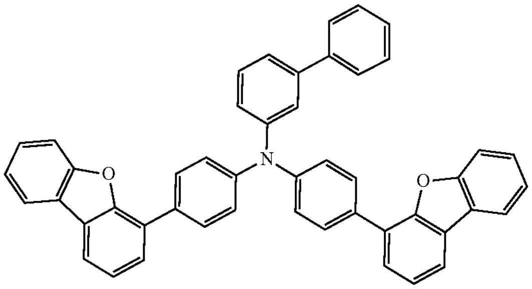
HT25
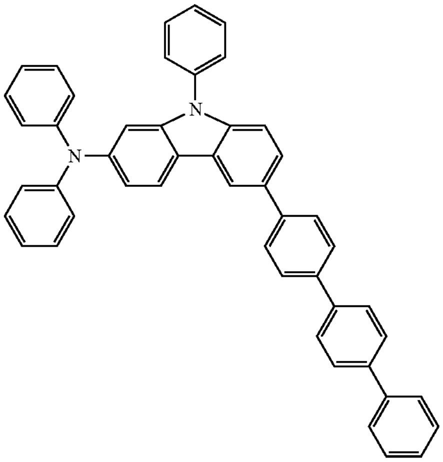
HT26
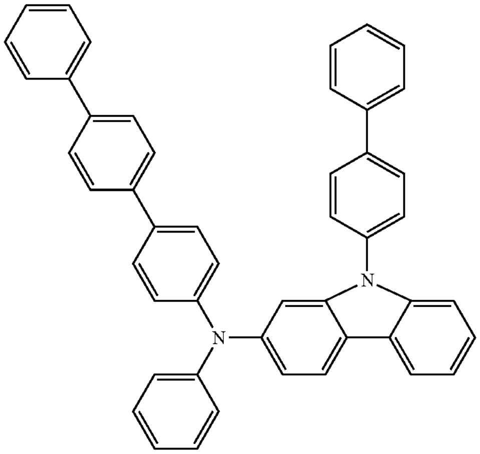
HT27
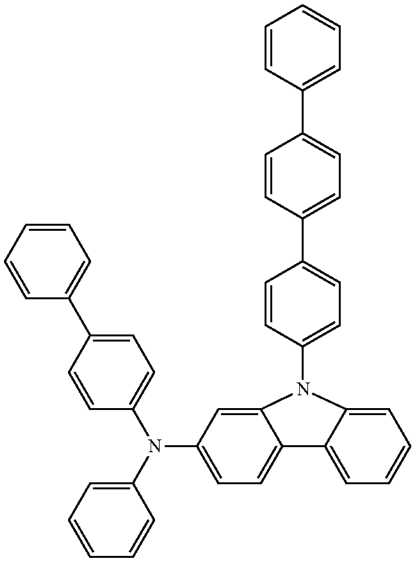

-continued
HT28
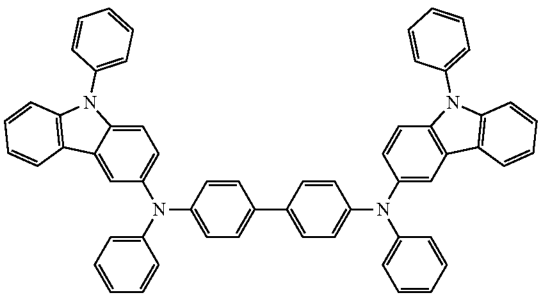
HT29
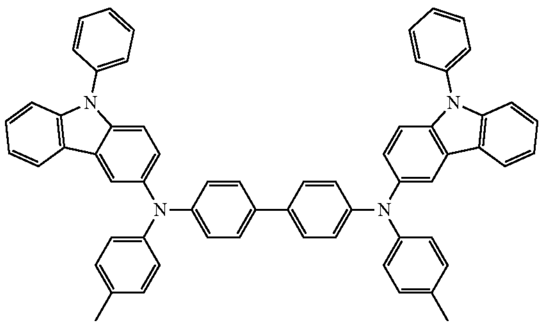
HT30
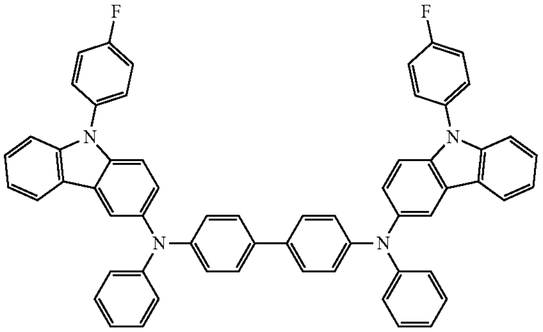
HT31
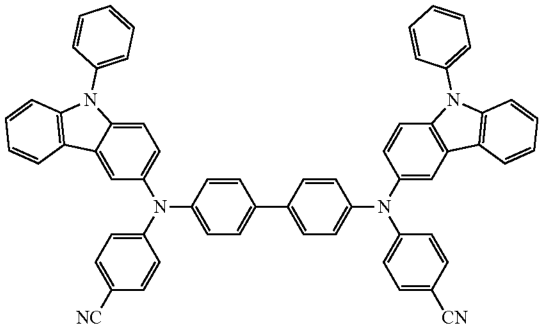
HT32
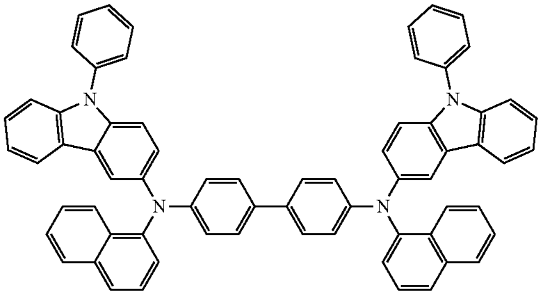
HT33
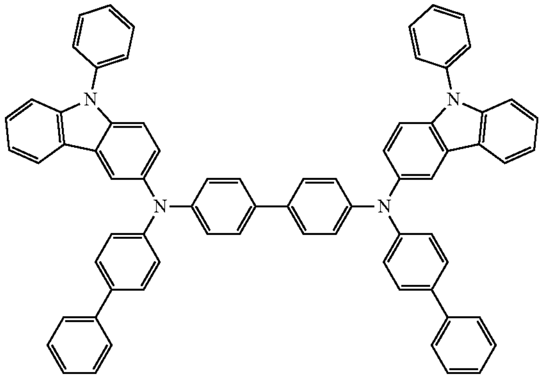
HT34
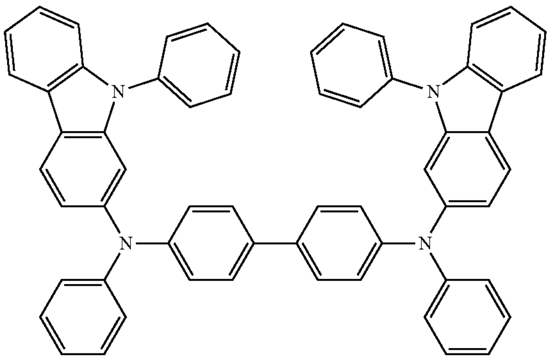
HT35
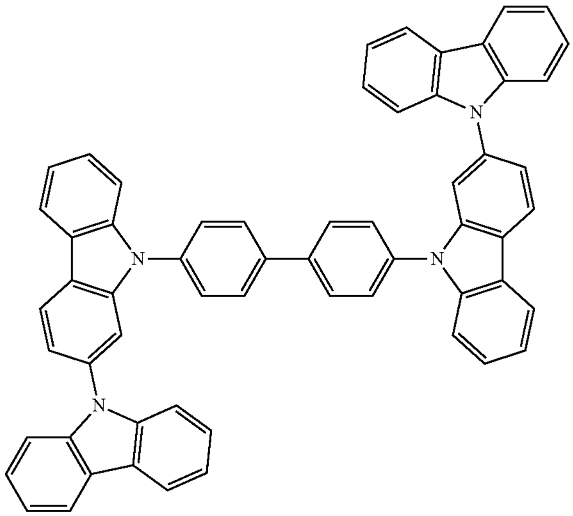

-continued
HT36
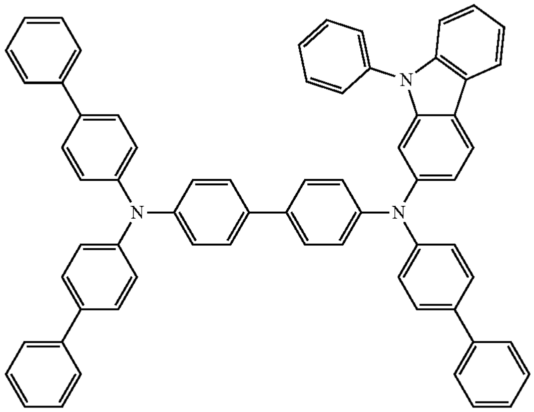
HT37
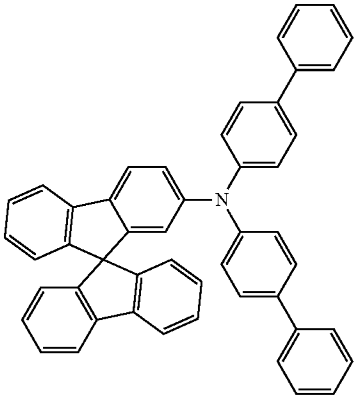
HT38
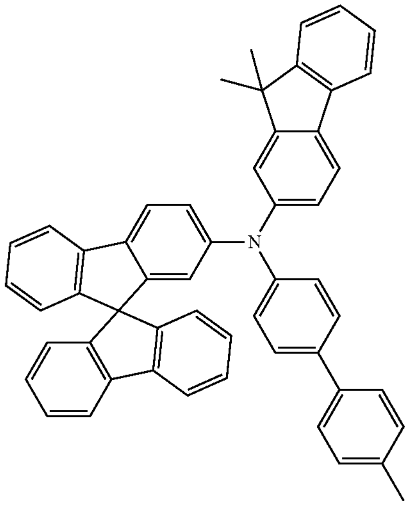
HT39
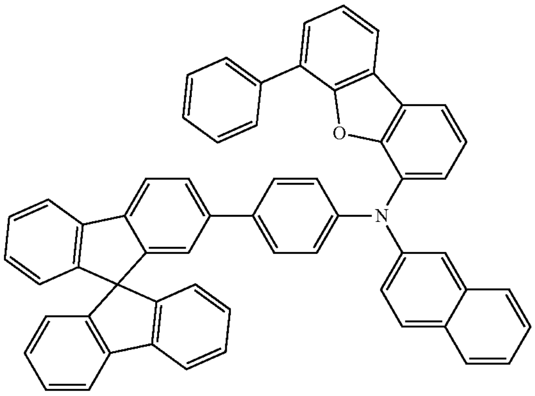
HT40
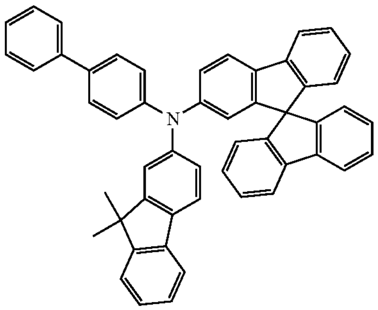
HT41
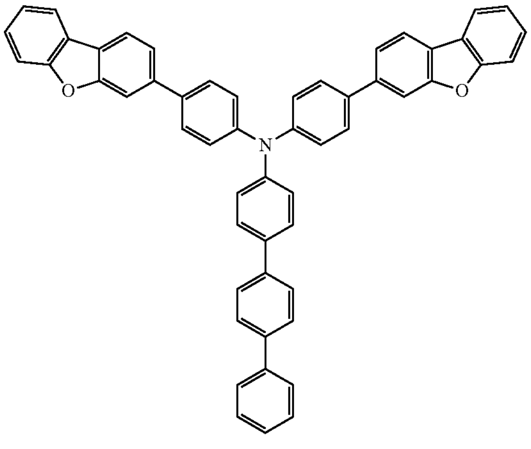

-continued
HT42
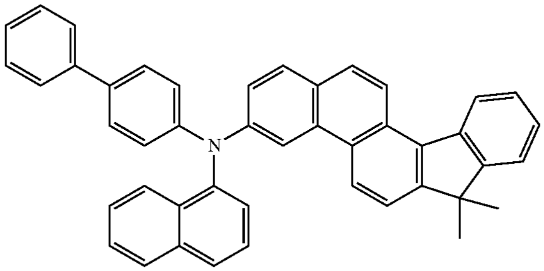
HT43
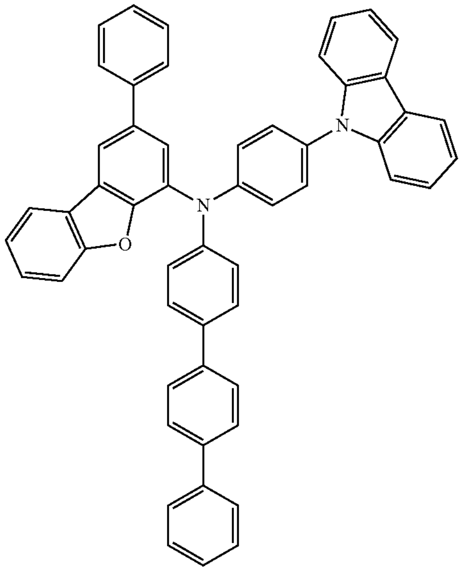
HT44
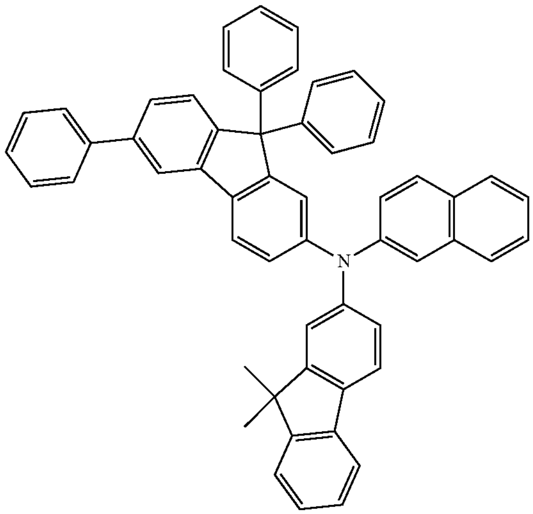
m-MTDATA
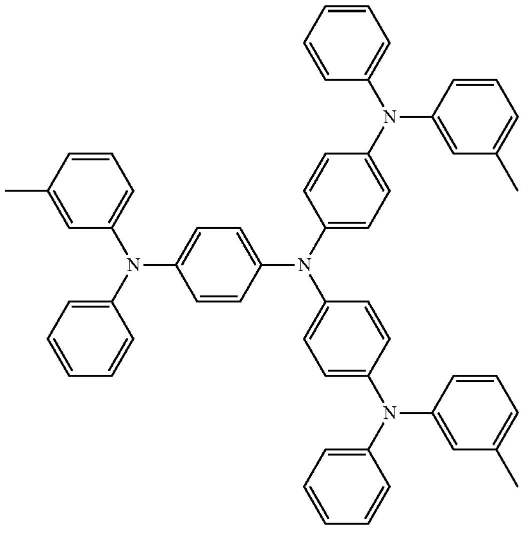

-continued
TDATA
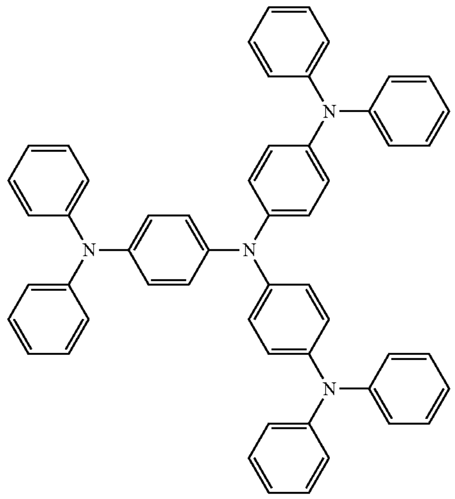
2-TNATA
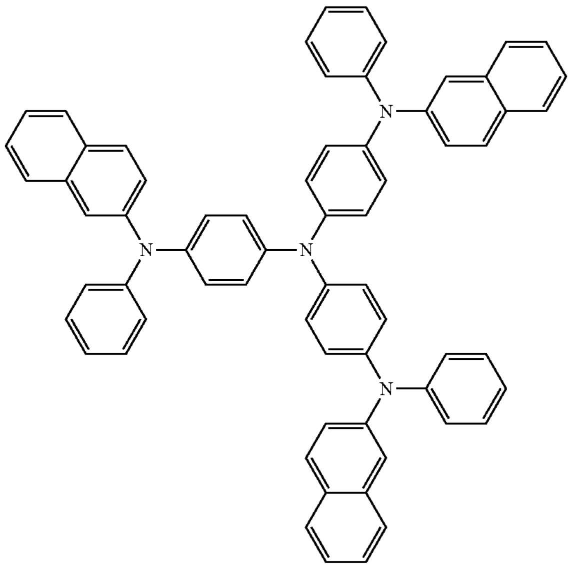
NPB
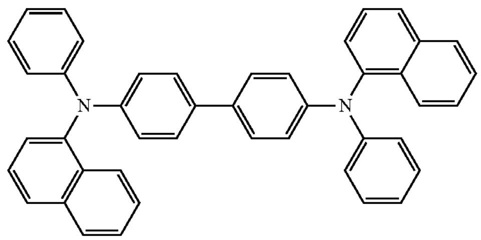
β-NPB
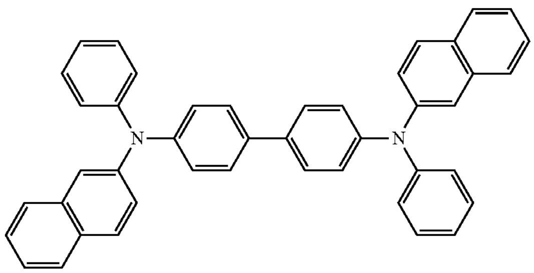
TPD
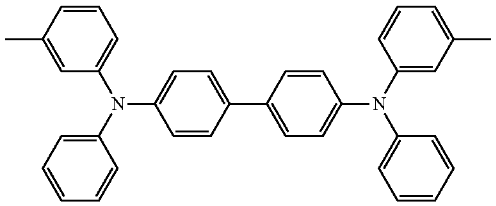
Spiro-TPD
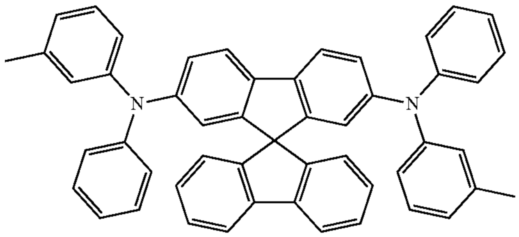
Spiro-NPB
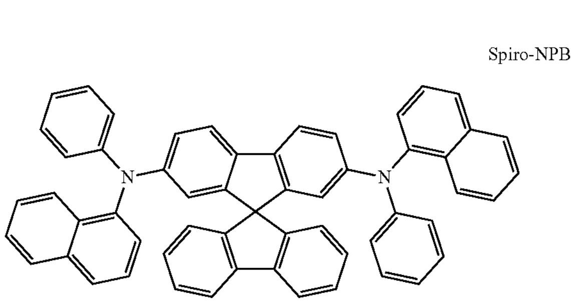
methylated-NPB
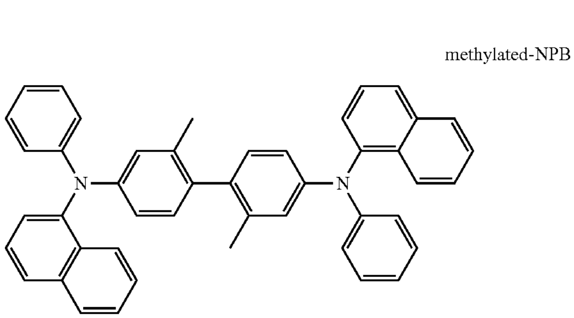

-continued

TAPC

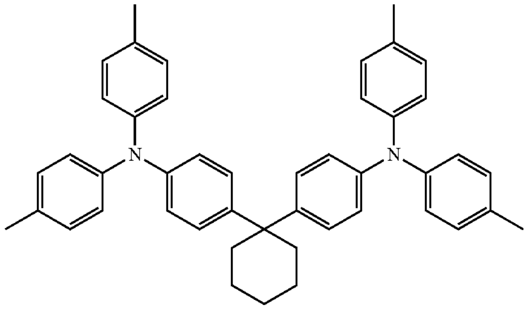

HMTPD

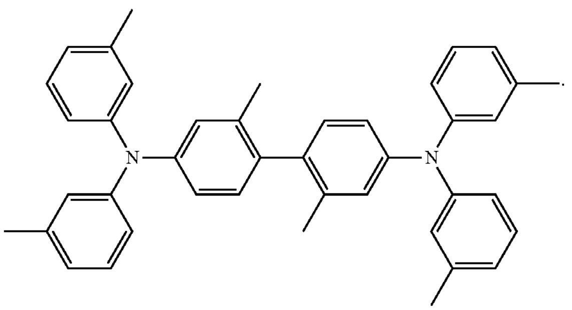

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by the emission layer 133, and the electron blocking layer may block or reduce the flow (e.g., leakage) of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be uniformly or non-uniformly dispersed in the hole transport region (for example, in the form of a single layer including (e.g., consisting of) the charge-generation material).

The charge-generation material may be, for example, a p-dopant.

In one or more embodiments, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2 (to be described in more detail below), or any combination thereof.

Examples of the quinone derivative may include (e.g., may be) TCNQ, F4-TCNQ, etc.

Examples of the cyano group-containing compound may include (e.g., may be) HAT-CN, and a compound represented by Formula 221:

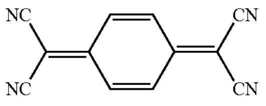

TCNQ

-continued

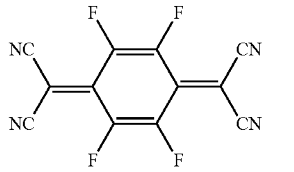

F4-TCNQ

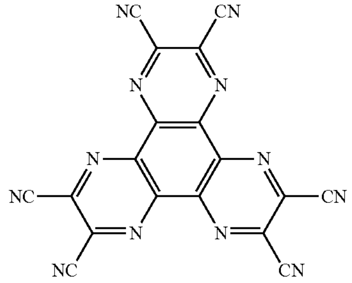

HAT-CN

Formula 221

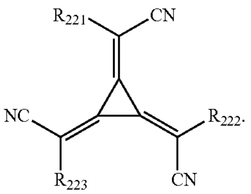

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Examples of the metal may include (e.g., may be) an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include (e.g., may be) silicon (Si), antimony (Sb), and tellurium (Te).

Examples of the non-metal may include (e.g., may be) oxygen (O) and halogen (for example, F, Cl, Br, I, etc.).

Examples of the compound including element EL1 and element EL2 may include (e.g., may be) a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Examples of the metal oxide may include (e.g., may be) tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include (e.g., may be) an alkali metal halide, an alkaline earth metal halide, a transition metal halide, a post-transition metal halide, and a lanthanide metal halide.

Examples of the alkali metal halide may include (e.g., may be) LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include (e.g., may be) $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $Sr_{12}$, and $BaI_2$.

Examples of the transition metal halide may include (e.g., may be) titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include (e.g., may be) zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include (e.g., may be) YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

An example of the metalloid halide may include (e.g., may be) antimony halide (for example, $SbCl_5$, etc.).

Examples of the metal telluride may include (e.g., may be) an alkali metal telluride (for example, $Li_2Te$, a $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer 133

The emission layer 133 may include any suitable organic light-emitting material. The organic light-emitting material may include a host, a dopant, a delayed fluorescence material, or any combination thereof. The dopant may include a phosphorescent dopant, a fluorescence dopant, or any combination thereof. When the emission layer 133 includes a host and a dopant, an amount of the dopant may be in a range of about 0.01 part by weight to about 15 parts by weight based on 100 parts by weight of the host. A thickness of the emission layer 133 including an organic light-emitting material may be in a range of about 100 Å to about 1,000 Å, for example, about 200 Å to about 600 Å. When the thickness of the emission layer 133 is within these ranges, excellent or suitable light-emission characteristics may be obtained without a substantial increase in driving voltage.

In one or more embodiments, the emission layer 133 may include a quantum dot. The quantum dot may be a light-emitting quantum dot. The thickness of the emission layer 133 including the quantum dot may be from about 7 nm to about 100 nm, for example, about 10 nm to about 50 nm. Within these ranges, the light-emitting device may have excellent or suitable luminescence efficiency and/or lifespan properties due to the control of pores that may be generated by quantum dot particle arrangement.

When the light-emitting device is a full color light-emitting device, the emission layer 133 may include an emission layer that emits light of a different color for each sub-pixel (e.g., for each of two adjacent pixels).

Host

In one or more embodiments, the host may include a compound represented by Formula 301:

Formula 301

$$[Ar_{301}]_{xb11}—[(L_{301})_{xb1}—R_{301}]_{xb21}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each independently be the same as described in connection with $Q_1$.

In an embodiment, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ are respectively the same as described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In one embodiment, the host may include an alkaline earth-metal complex. For example, the host may include a Be complex (for example, Compound H55), an Mg complex, a Zn complex, or any combination thereof.

In an embodiment, the host may include at least one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

Formula 301-1

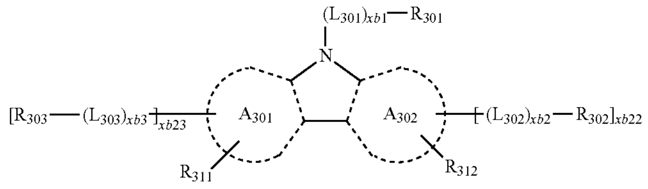

Formula 301-2

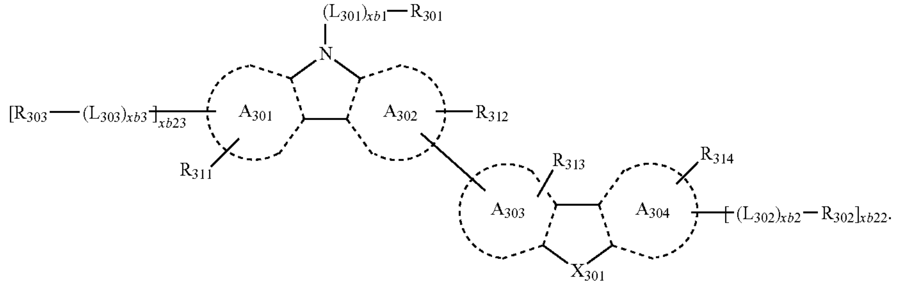

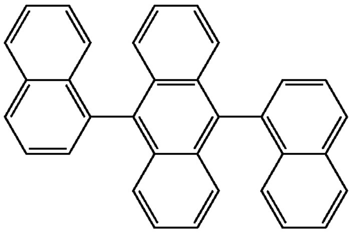
H1
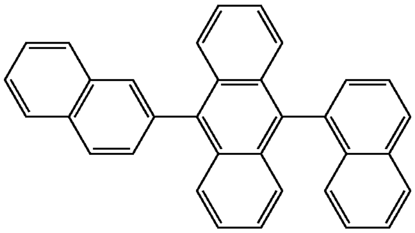
H2
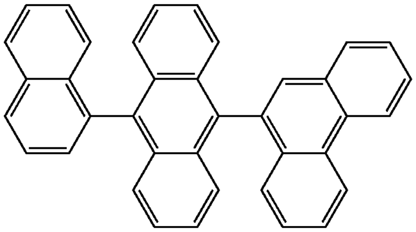
H3
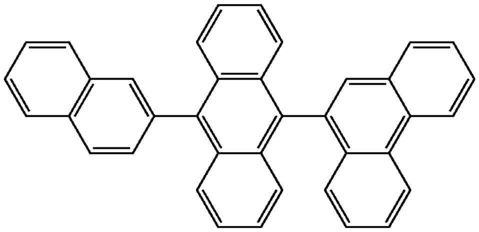
H4
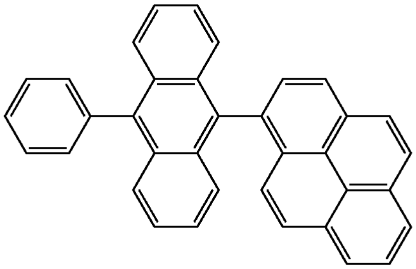
H5
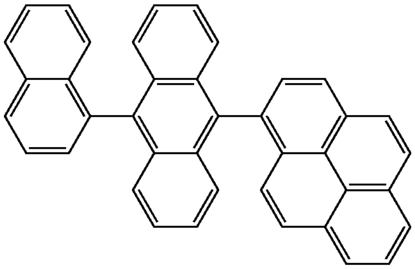
H6
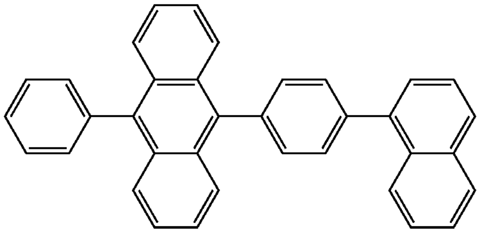
H7
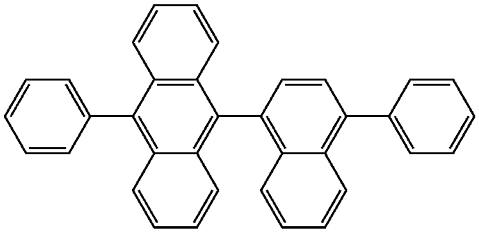
H8
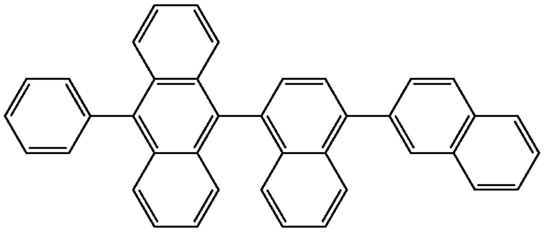
H9
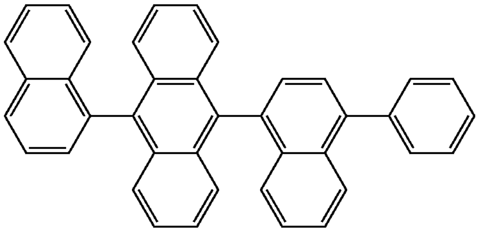
H10
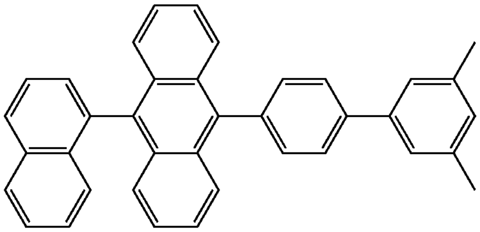
H11
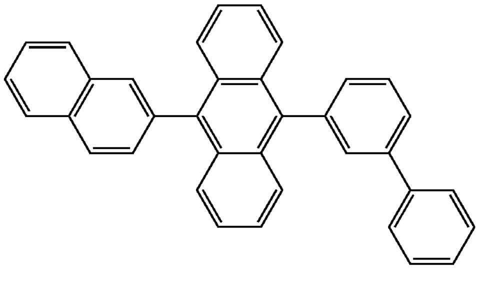
H12

-continued
H13
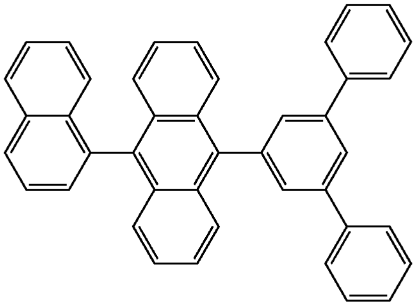
H14
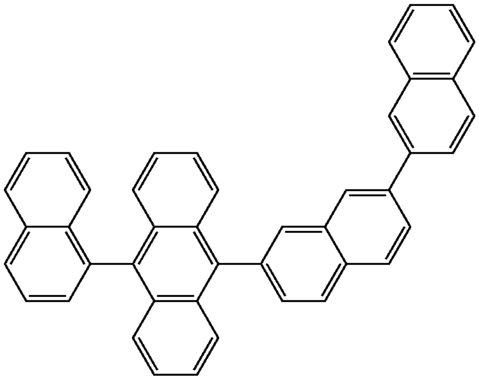
H15
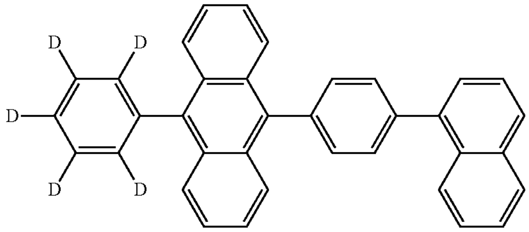
H16
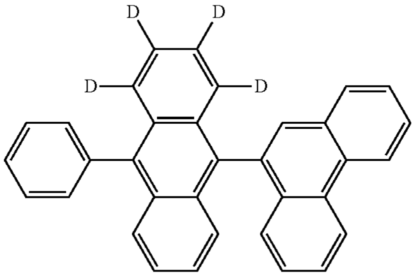
H17
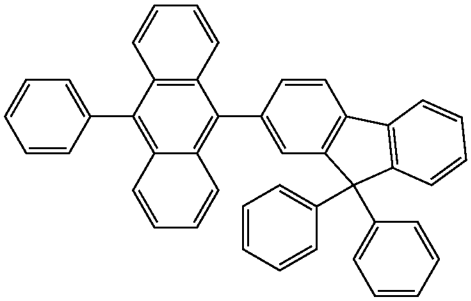
H18
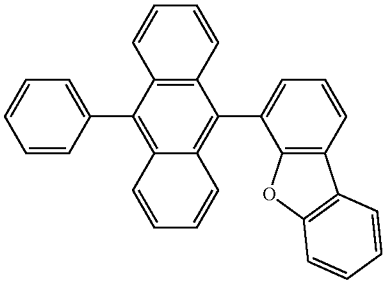
H19
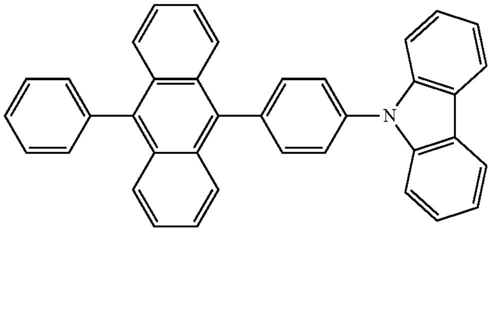
H20
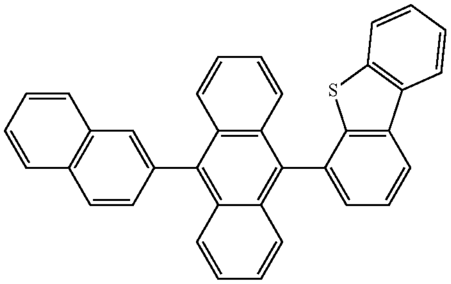

-continued
H21
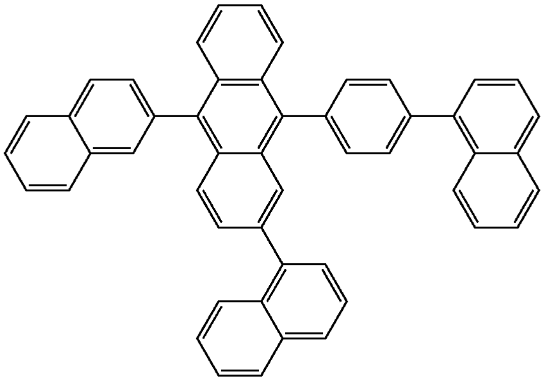
H22
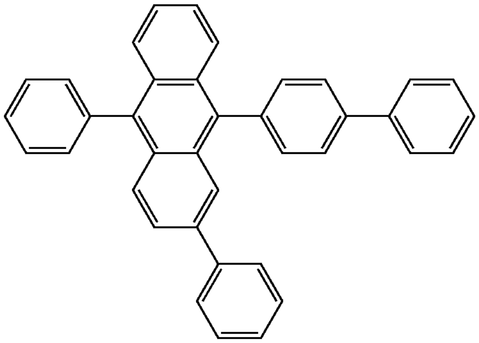
H23
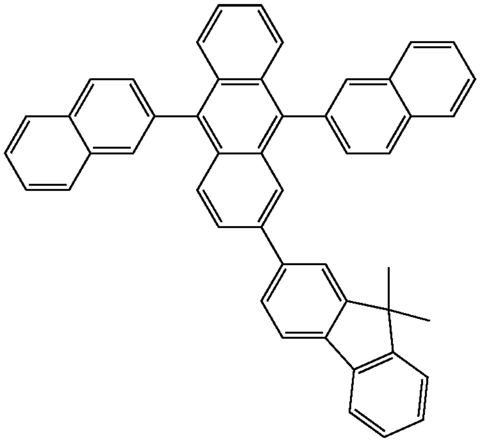
H24
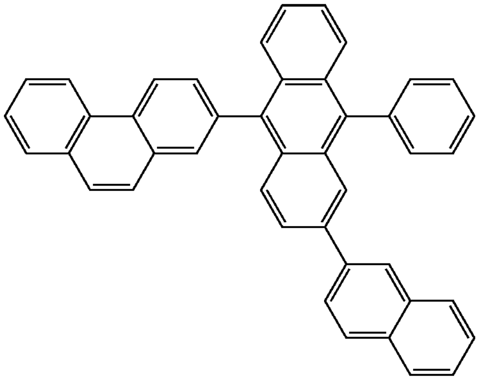
H25
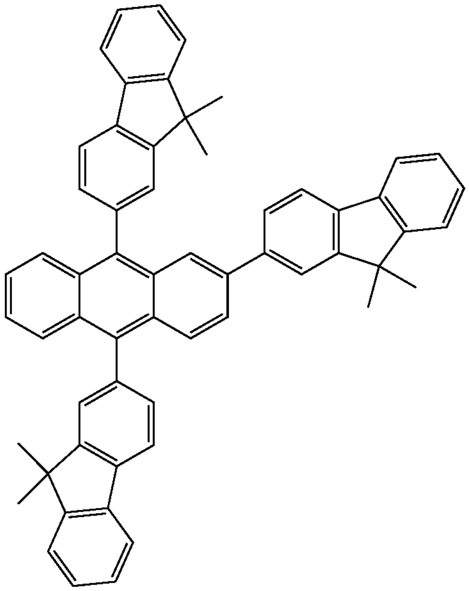
H26
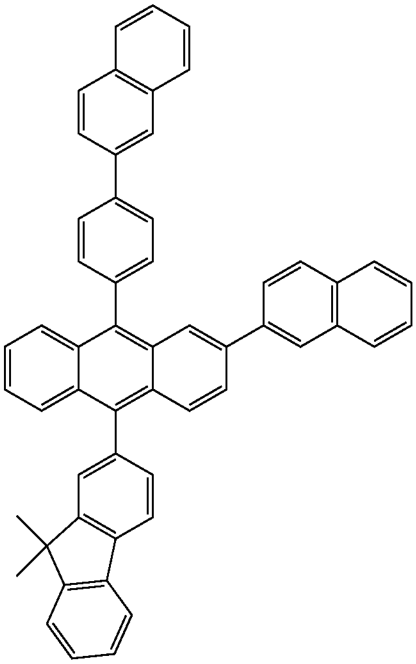

-continued
H27
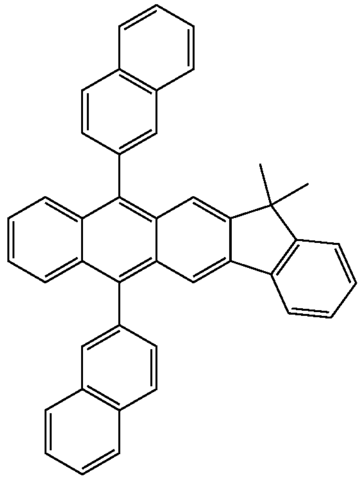
H28
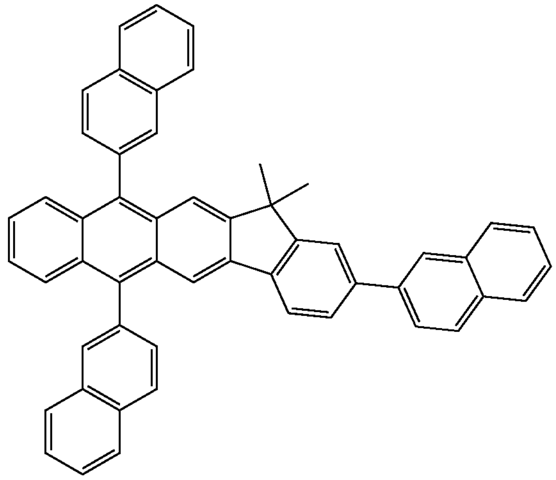
H29
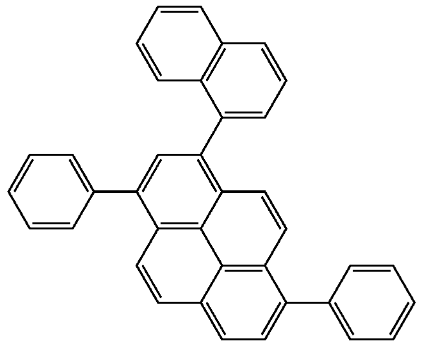
H30
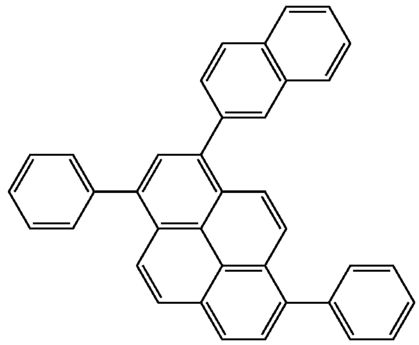
H31
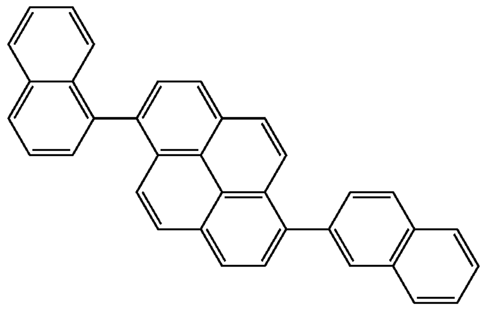
H32
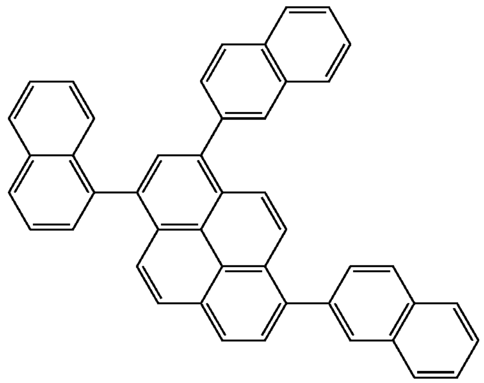
H33
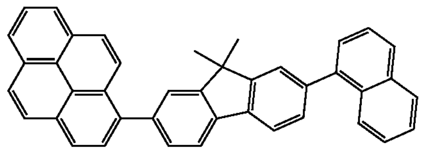
H34
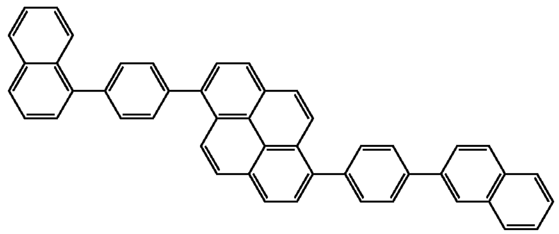

-continued
H35
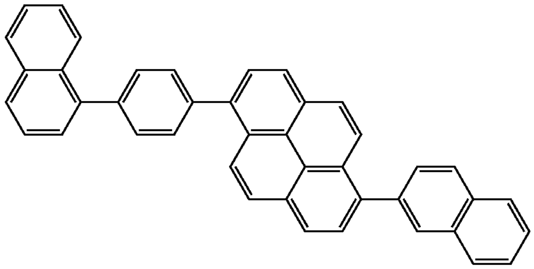
H36
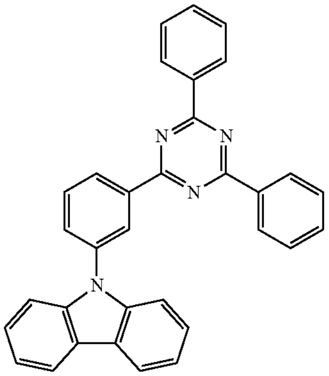
H37
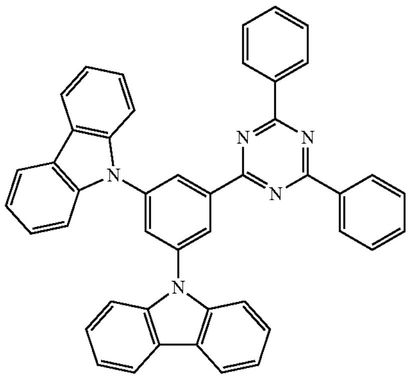
H38
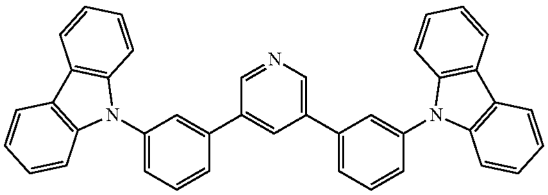
H39
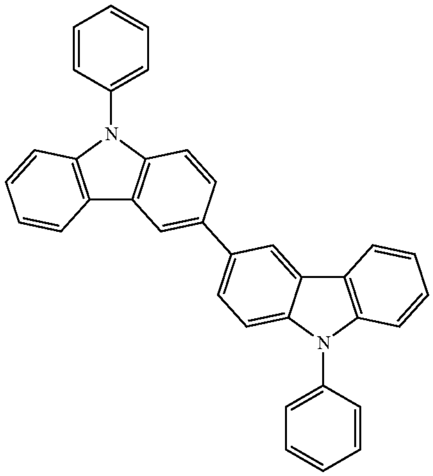
H40
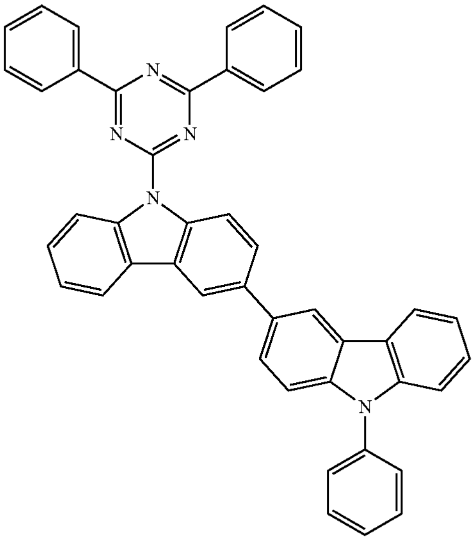

-continued
H41
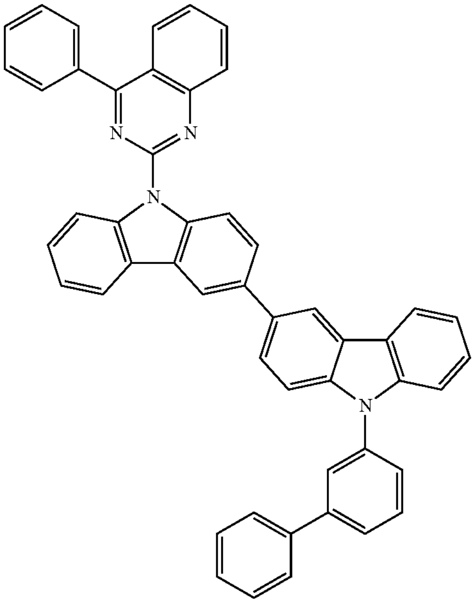
H42
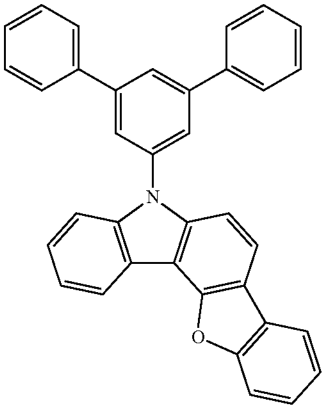
H43
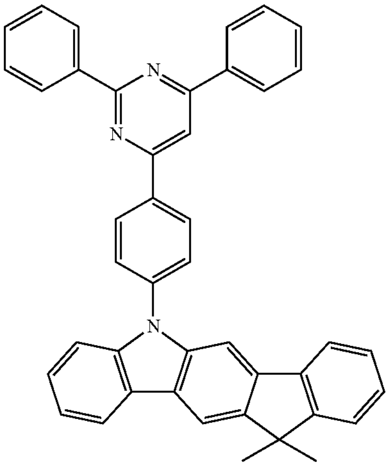
H44
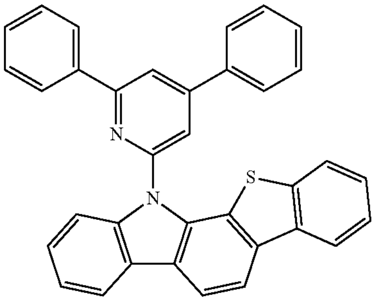
H45
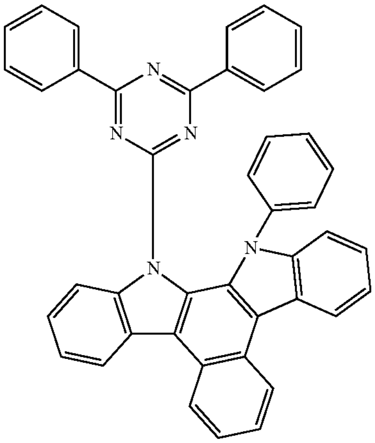
H46
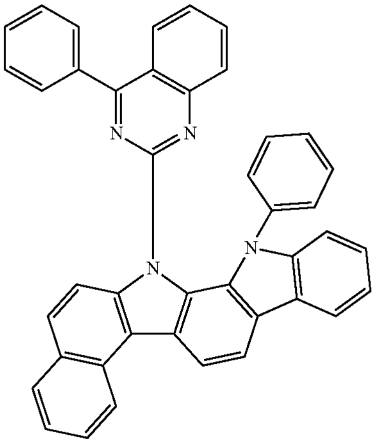

-continued
H47
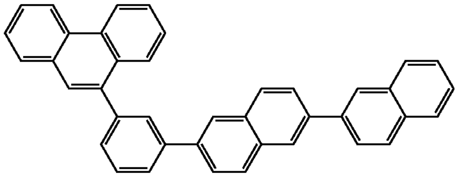
H48
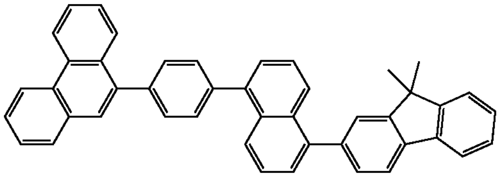
H49
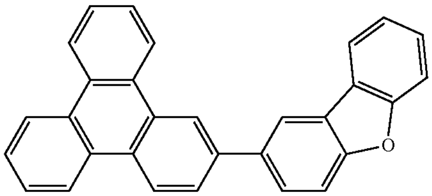
H50
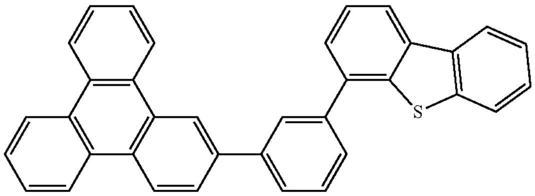
H51
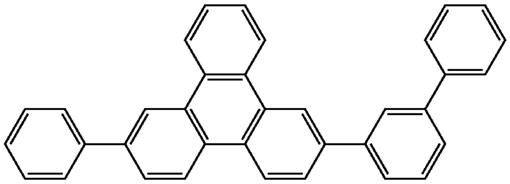
H52
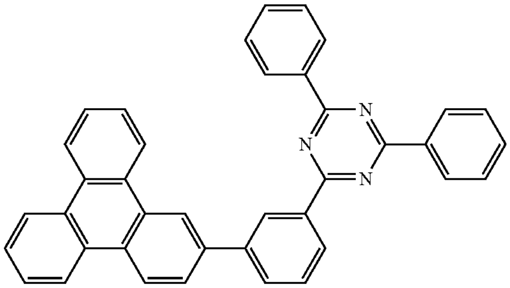
H53
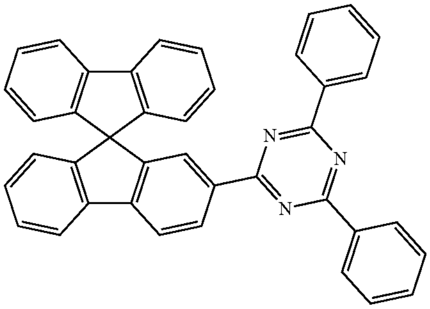
H54
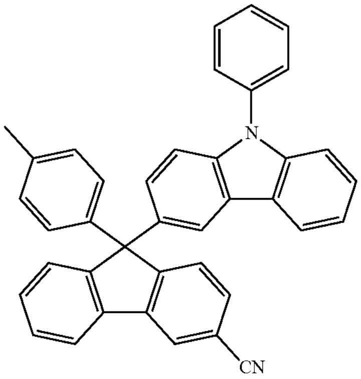
H55
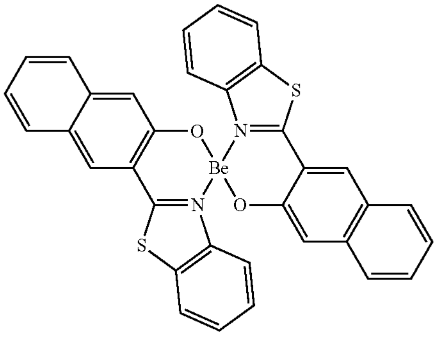
H56
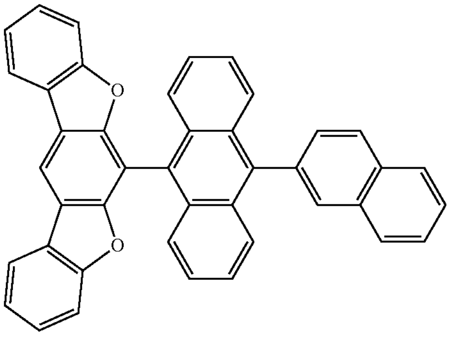

-continued
H57
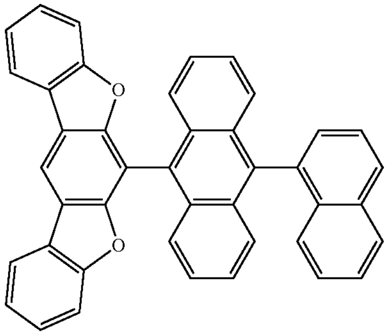
H58
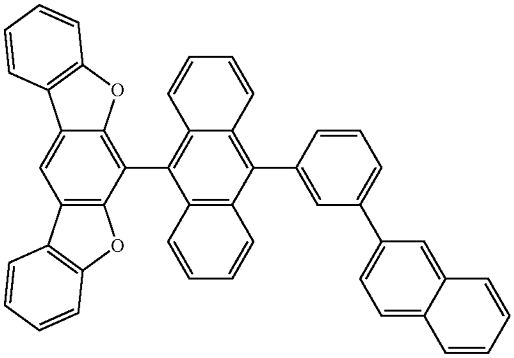
H59
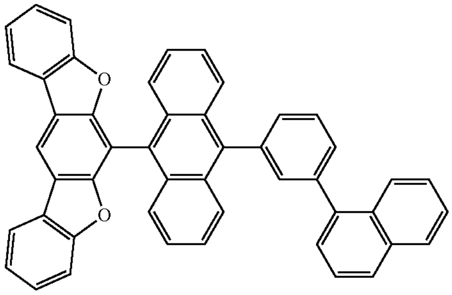
H60
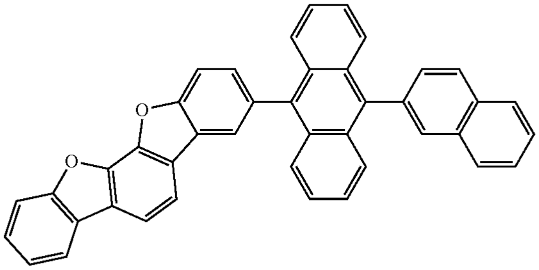
H61
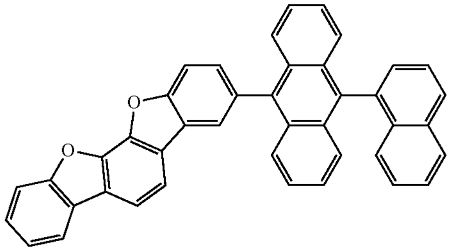
H62
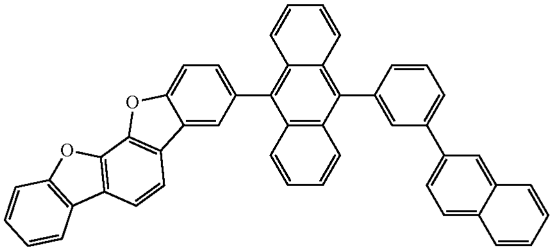
H63
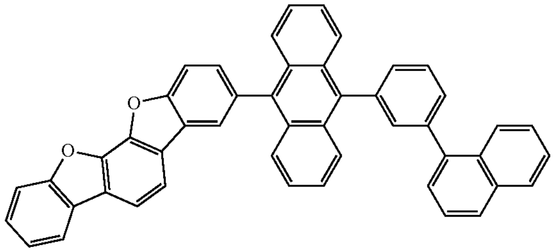
H64
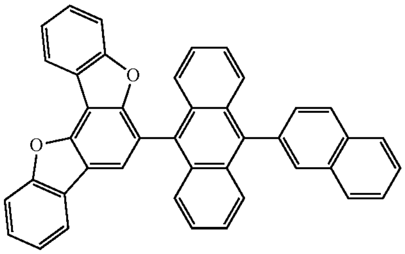
H65
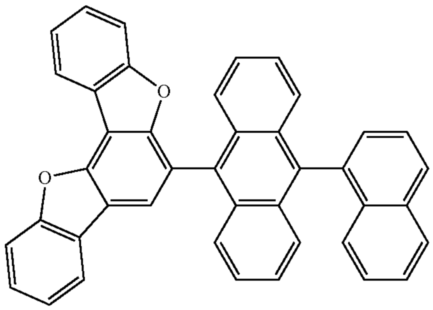
H66
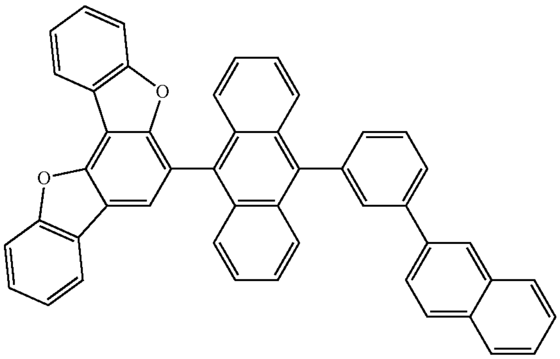

-continued
H67
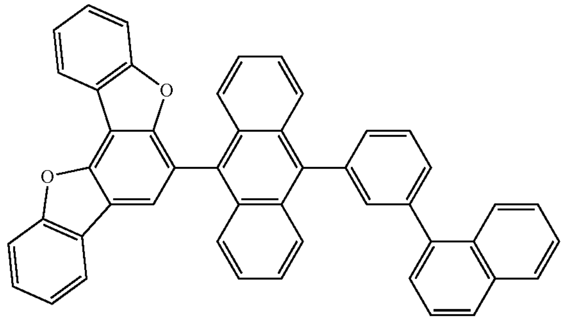
H68
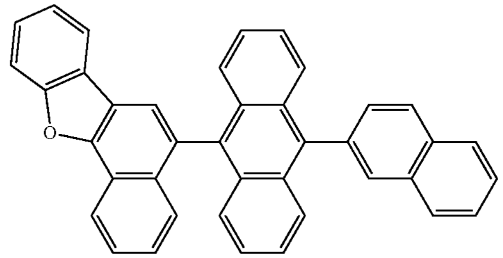
H69
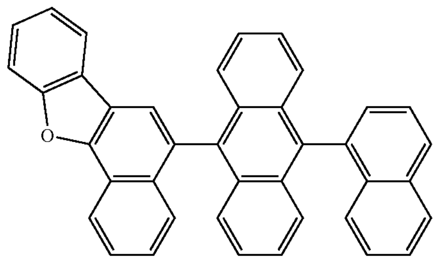
H70
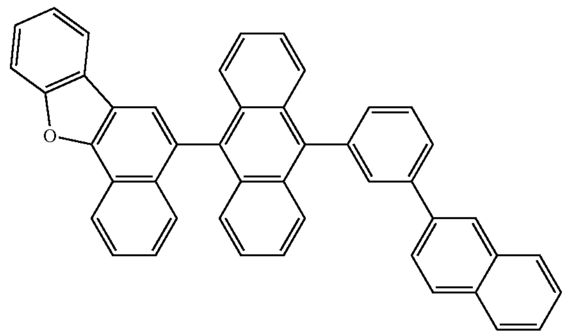
H71
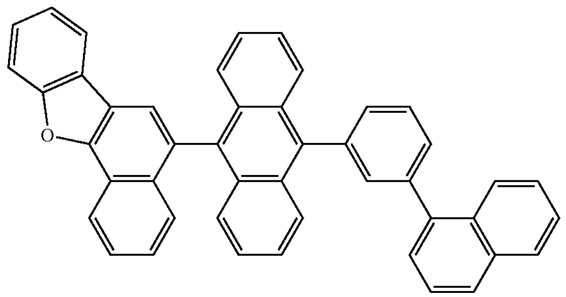
H72
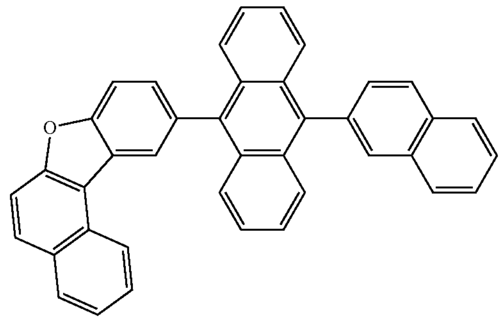
H73
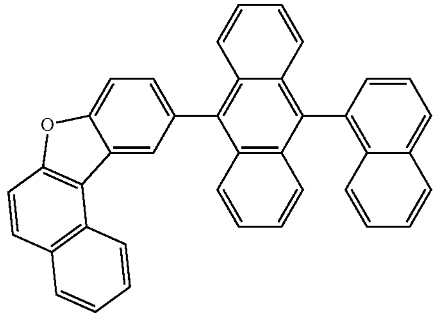
H74
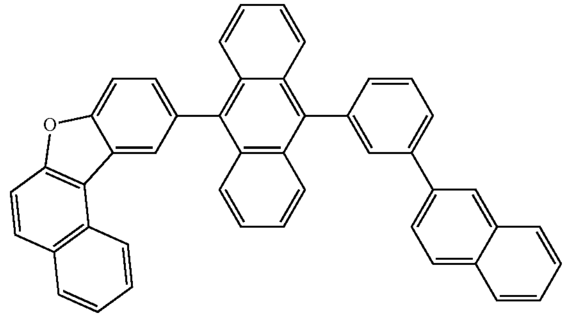

-continued
H75
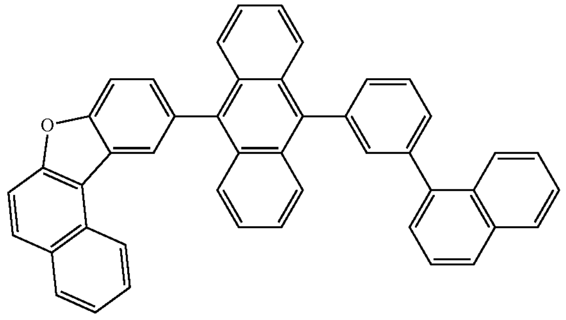
H76
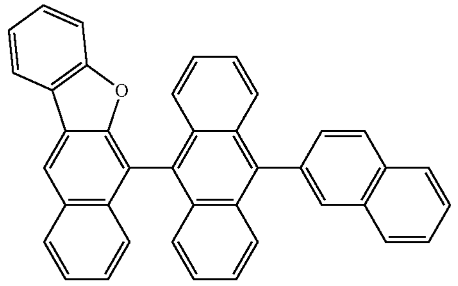
H77
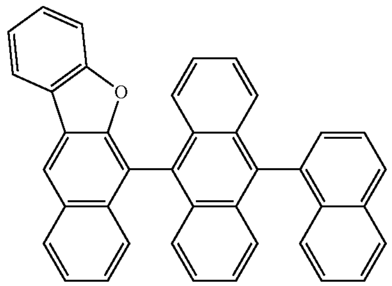
H78
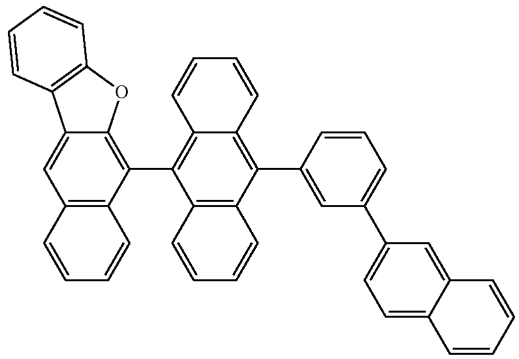
H79
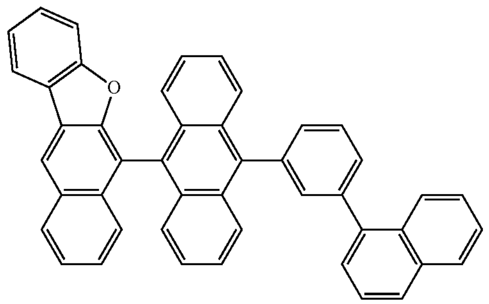
H80
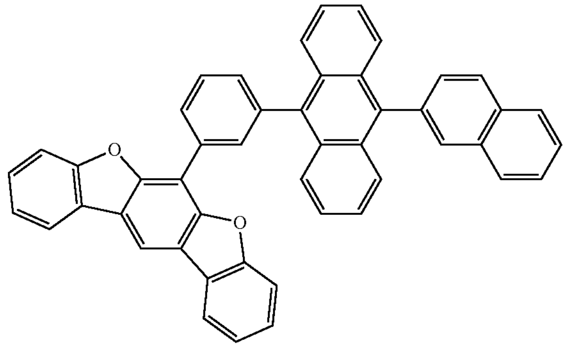
H81
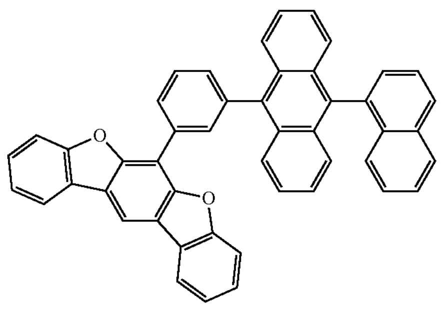
H82
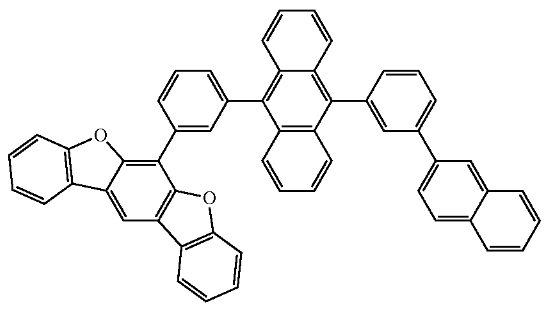

-continued
H83
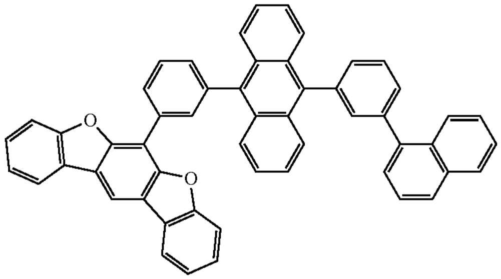
H84
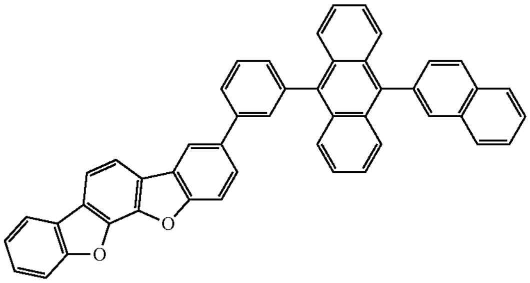
H85
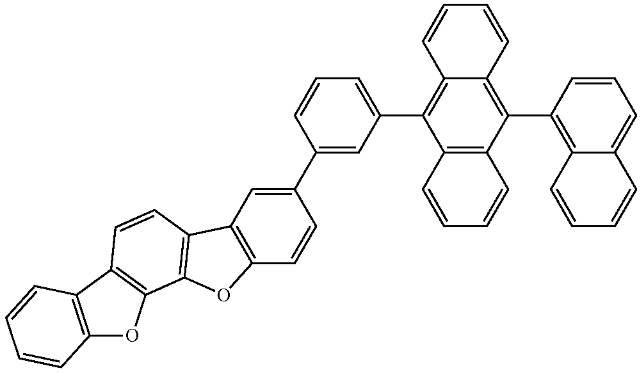
H86
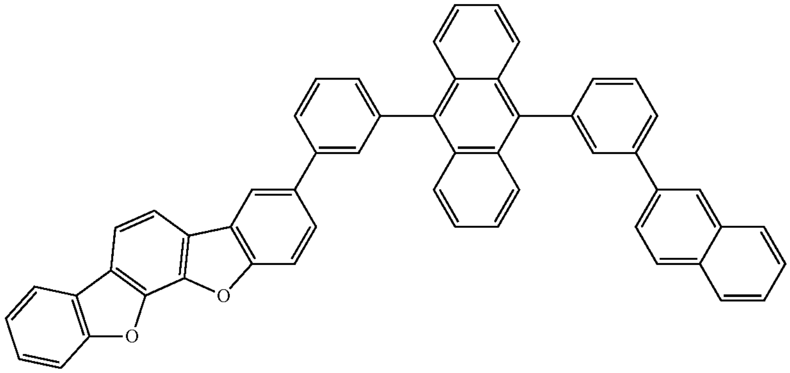
H87
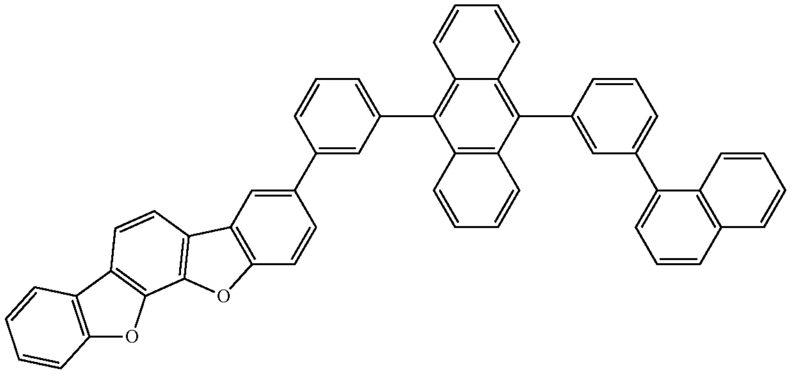

-continued
H88
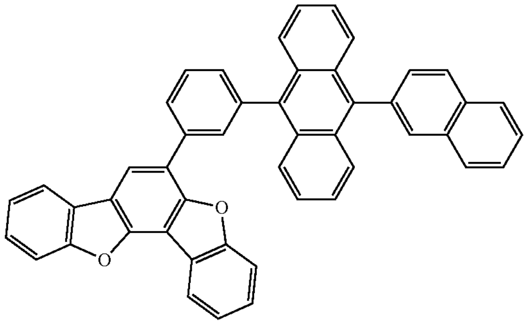
H89
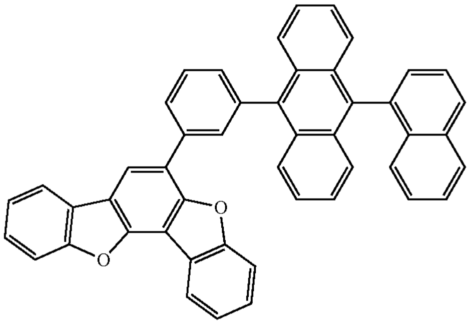
H90
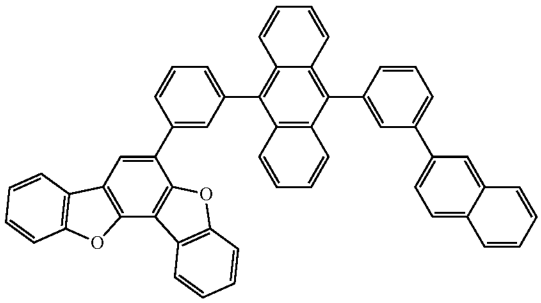
H91
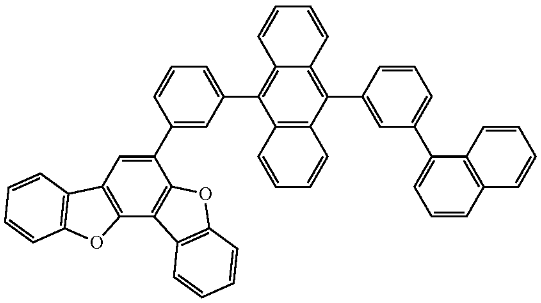
H92
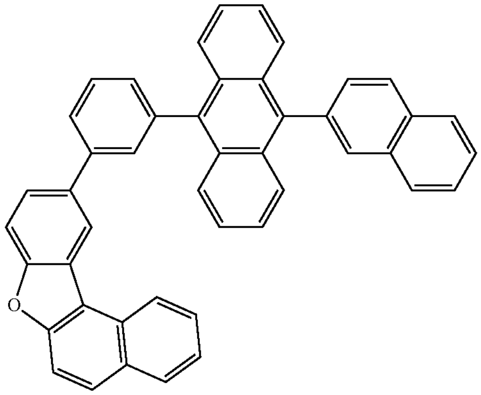
H93
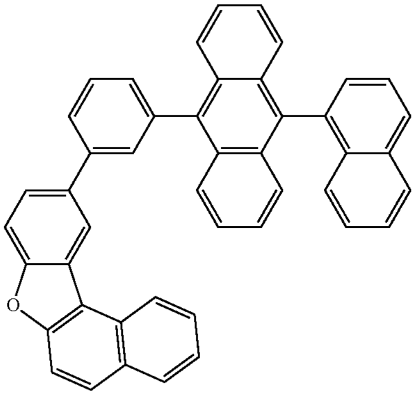
H94
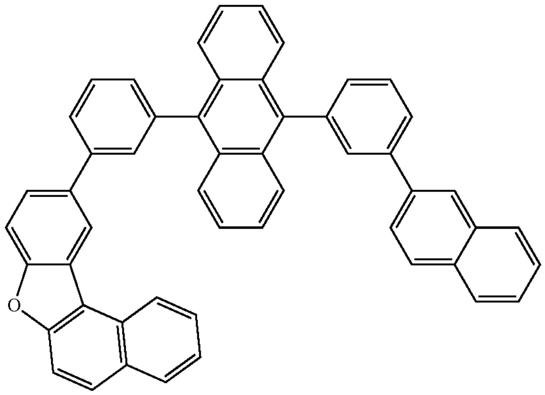
H95
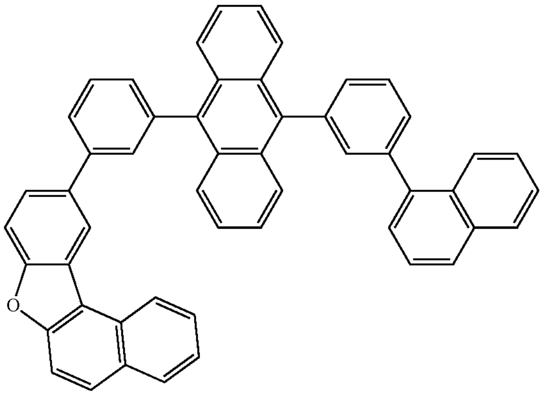

-continued
H96
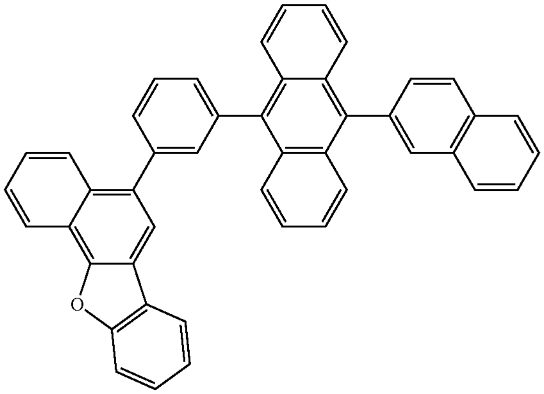
H97
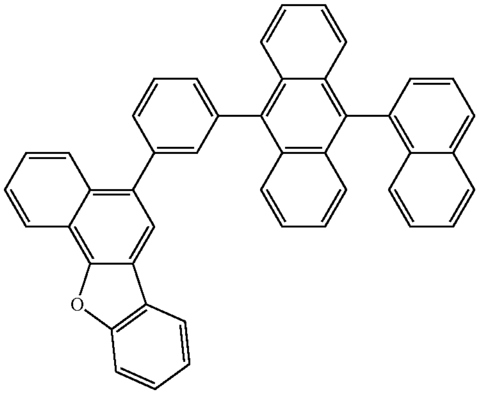
H98
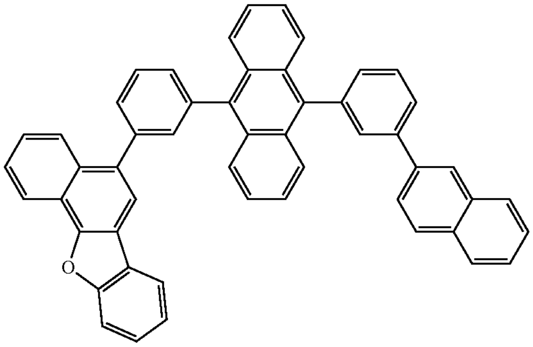
H99
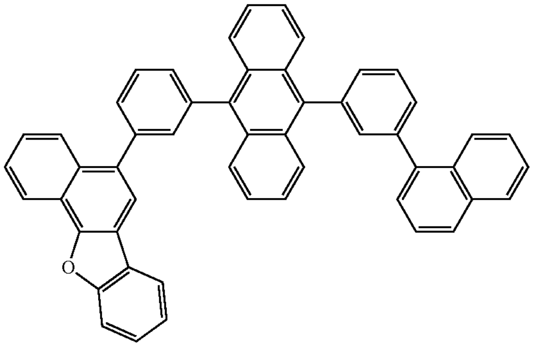
H100
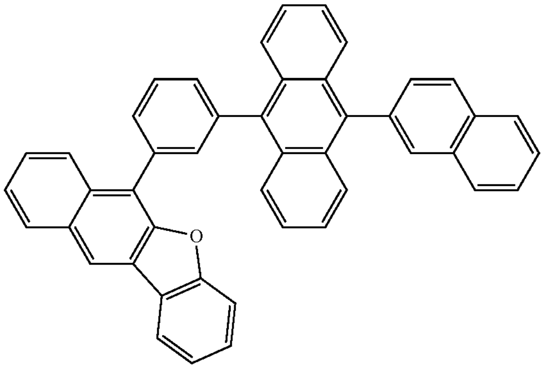
H101
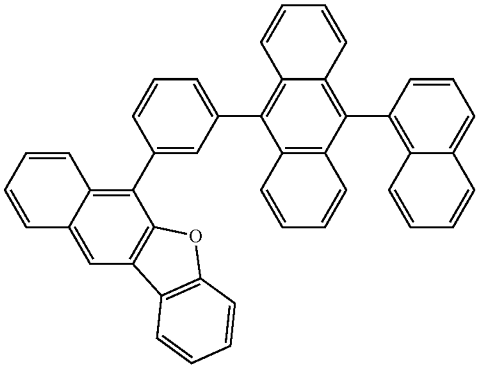
H102
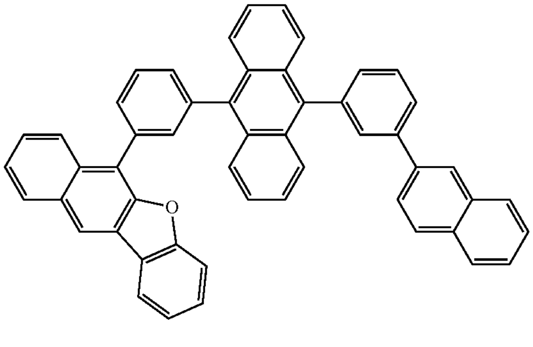
H103
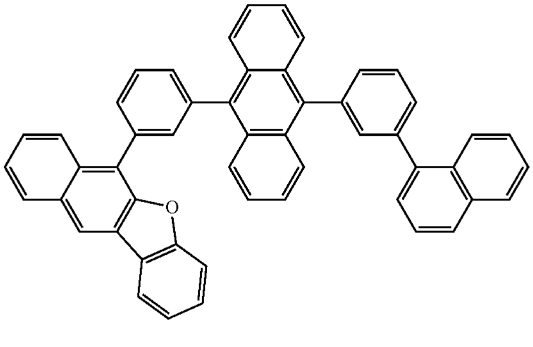

-continued
H104
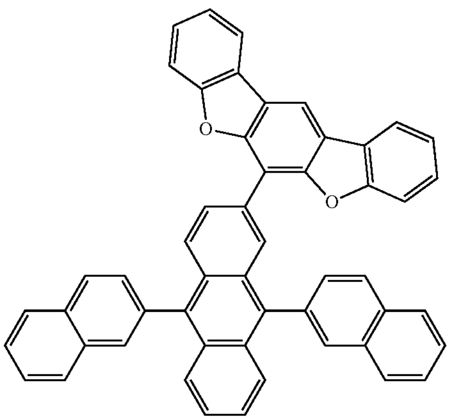
H105
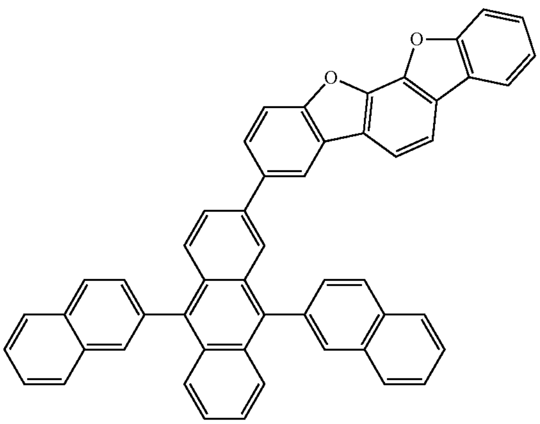
H106
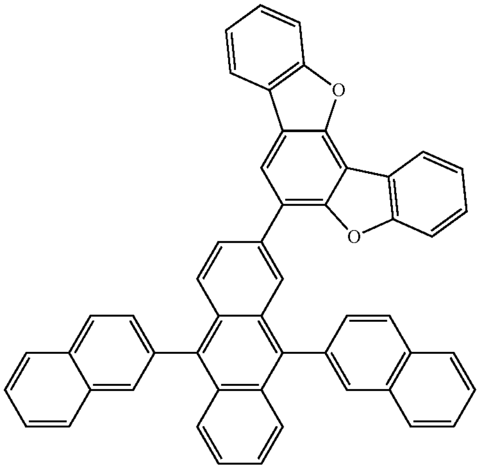
H107
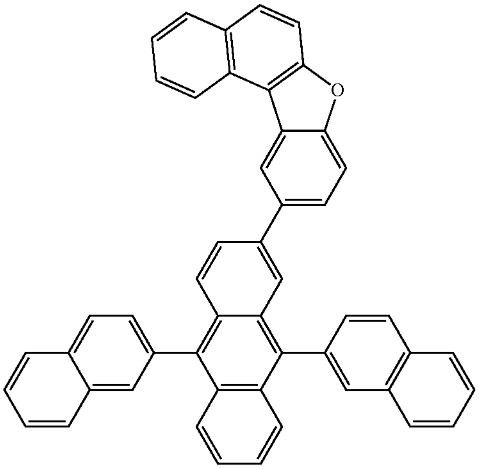
H108
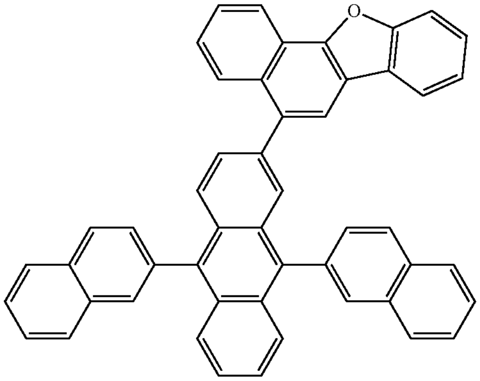
H109
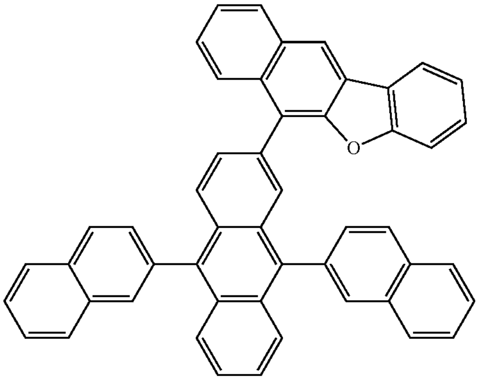
H110
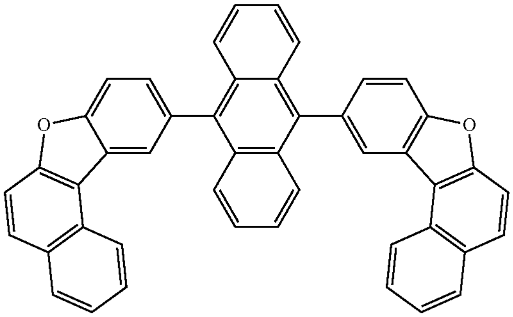
H111
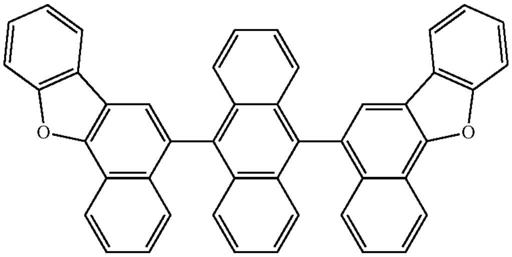

-continued
H112
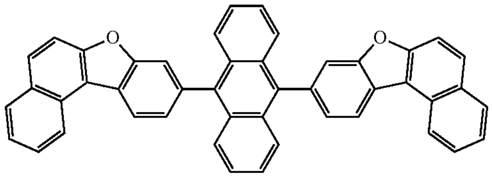
H113
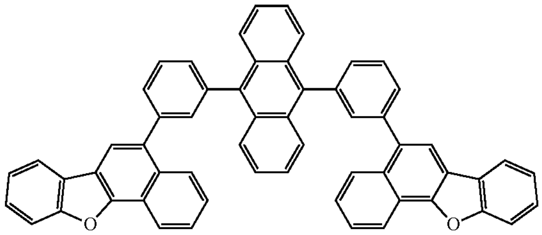
H114
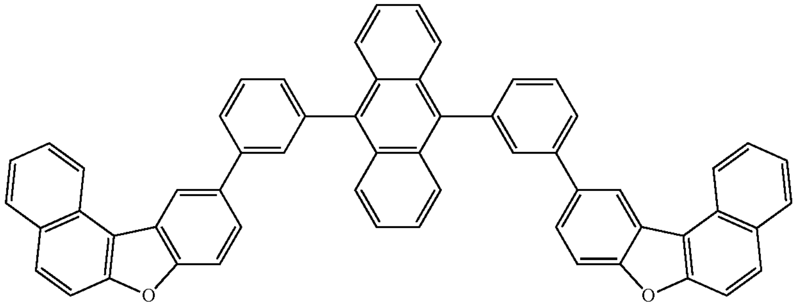
H115
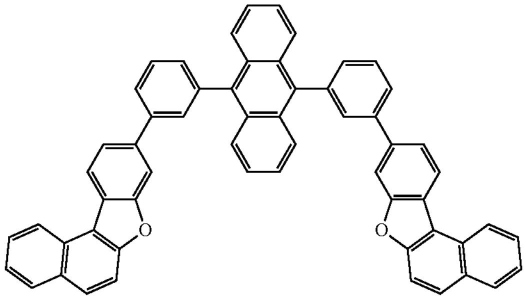
H116
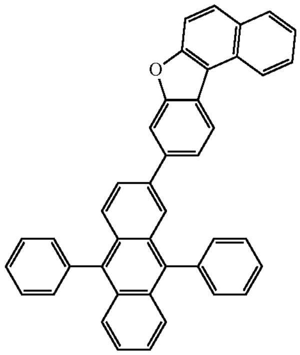
H117
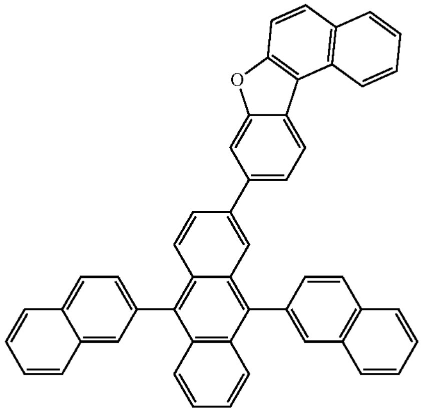
H118
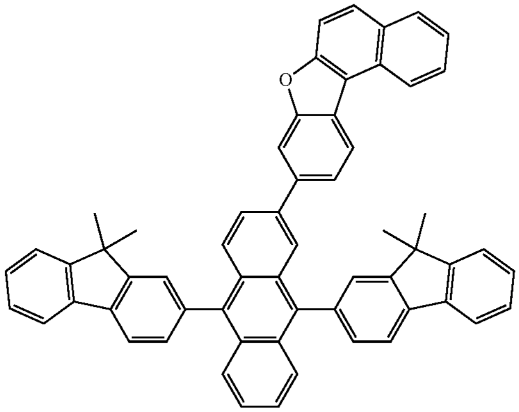

-continued
H119
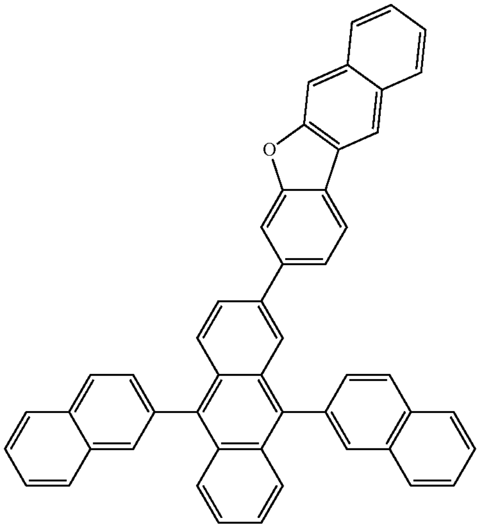
H120
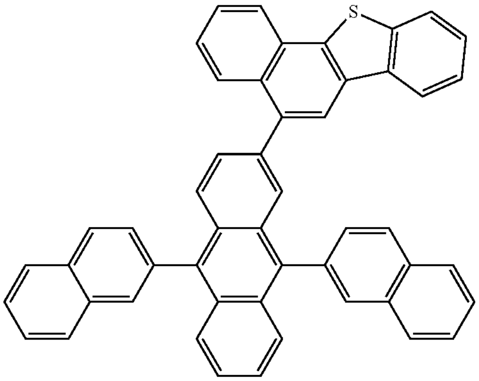
H121
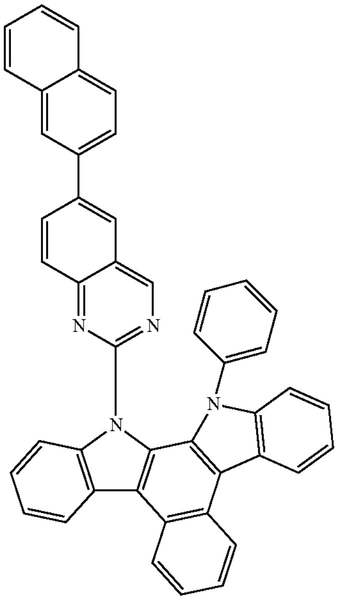
H122
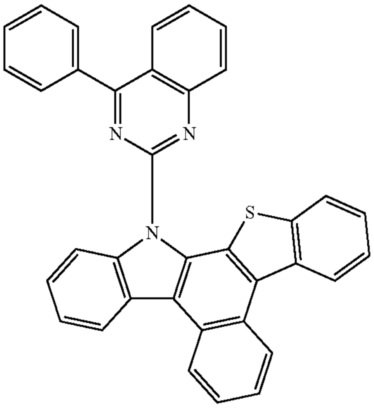
H123
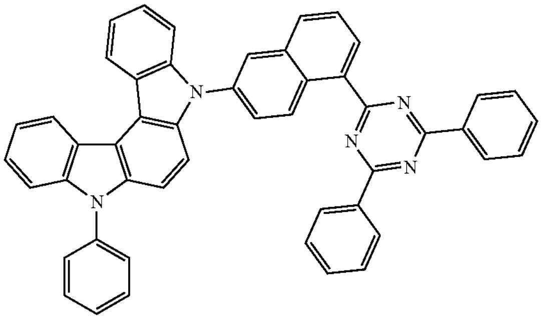
H124
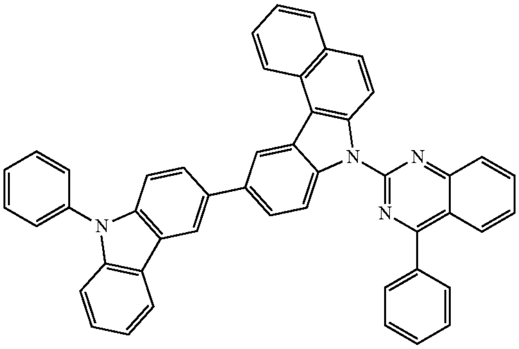

Phosphorescent Dopant

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

Formula 401

$M(L_{401})_{xc1}(L_{402})_{xc2}$

Formula 402

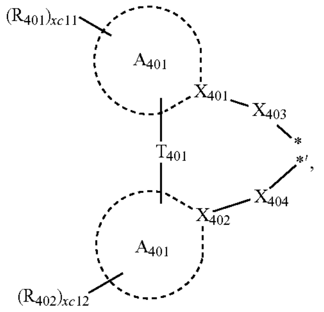

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)(0402)(0403), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via $T_{402}$, which is a linking group, and/or two ring $A_{402}$(s) may be optionally linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN, a phosphorus group (for example, a phosphine group, a phosphite group, etc.), or any combination thereof.

The phosphorescent dopant may include, for example, at least one of compounds PD1 to PD25, or any combination thereof:

PD1

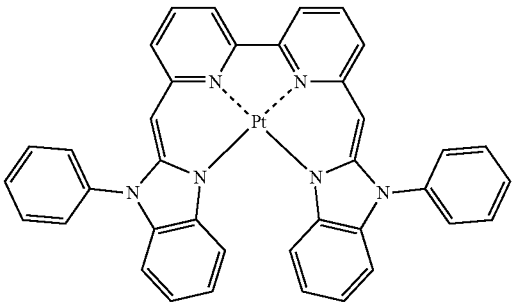

PD2

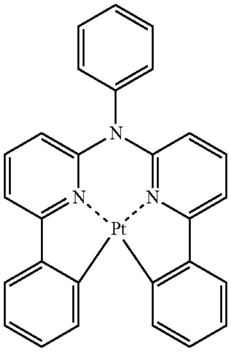

PD3

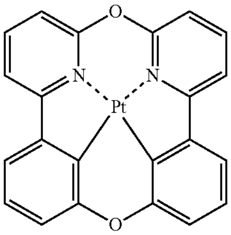

-continued
PD4
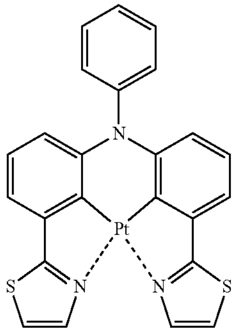
PD5
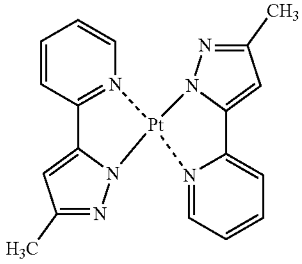
PD6
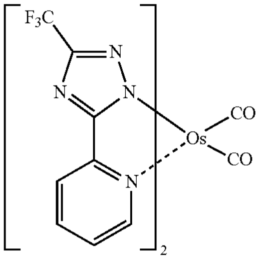
PD7
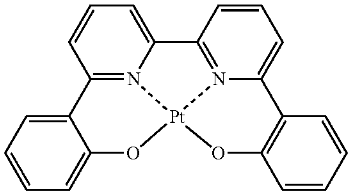
PD8
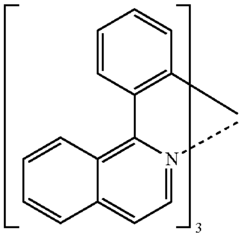
PD9
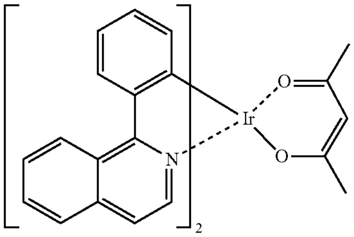
-continued
PD10
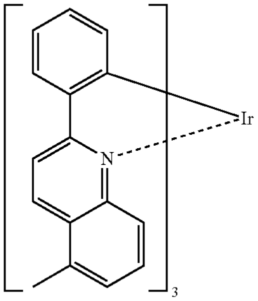
PD11
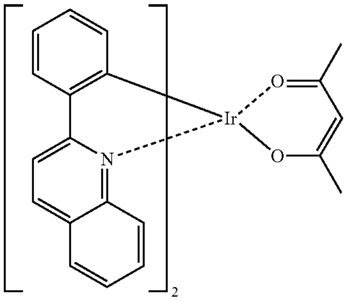
PD12
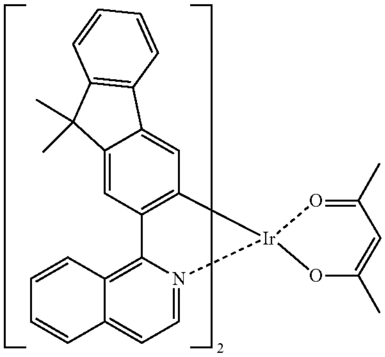
PD13
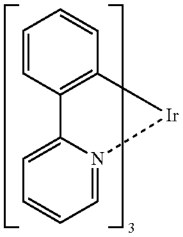
PD14
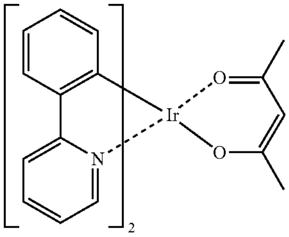

-continued
PD15
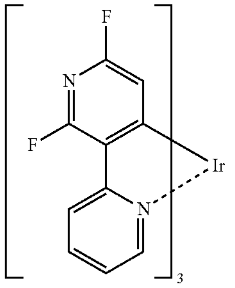
PD16
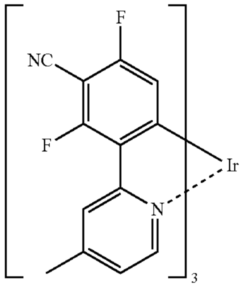
PD17
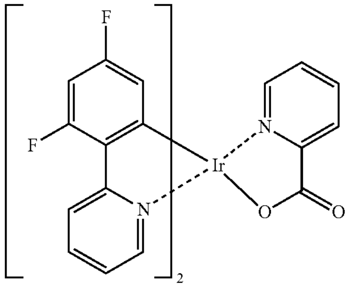
PD18
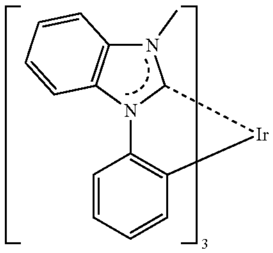
PD19
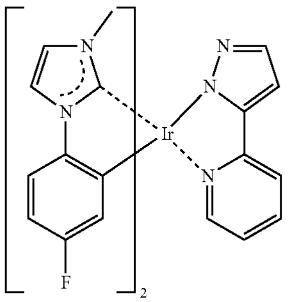
-continued
PD20
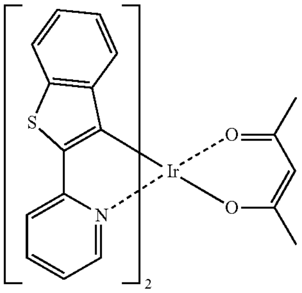
PD21
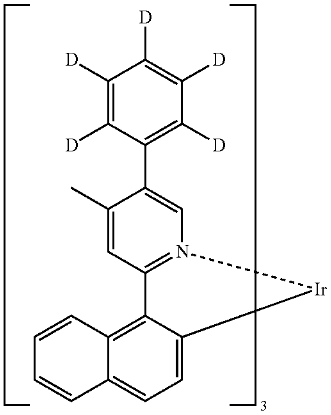
PD22
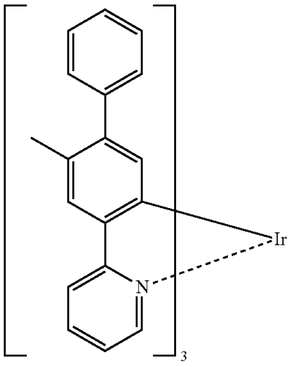
PD23
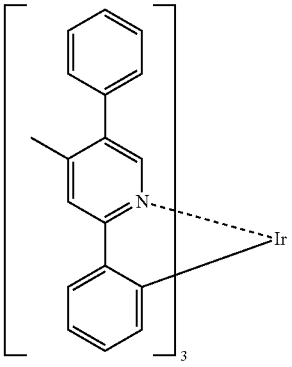

-continued

PD24

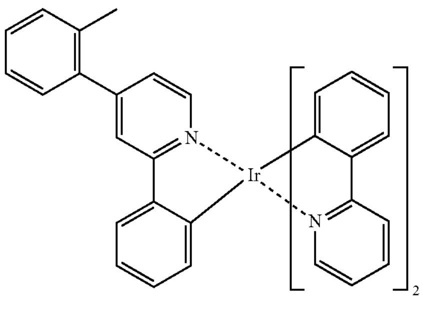

PD25

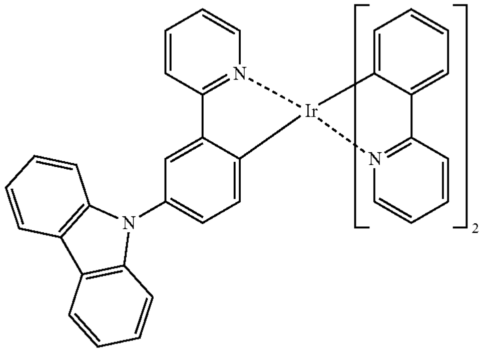

Fluorescence Dopant

The fluorescence dopant may include an amine group-containing compound, a styryl group-containing compound, or any combination thereof.

In one or more embodiments, the fluorescence dopant may include a compound represented by Formula 501:

Formula 501

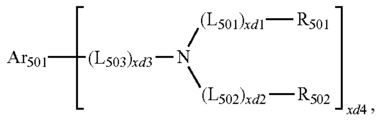

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together (e.g., combined together).

In one or more embodiments, xd4 in Formula 501 may be 2.

In one or more embodiments, the fluorescence dopant may include: at least one of Compounds FD1 to FD36; DPVBi; DPAVBi; or any combination thereof:

FD1

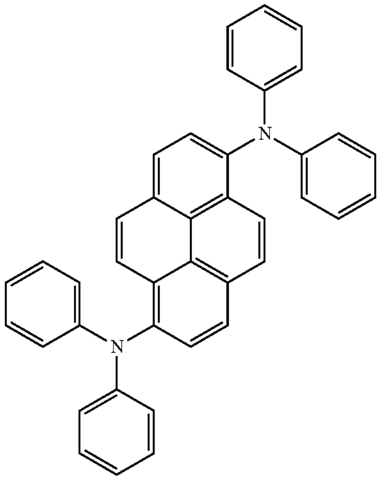

FD2

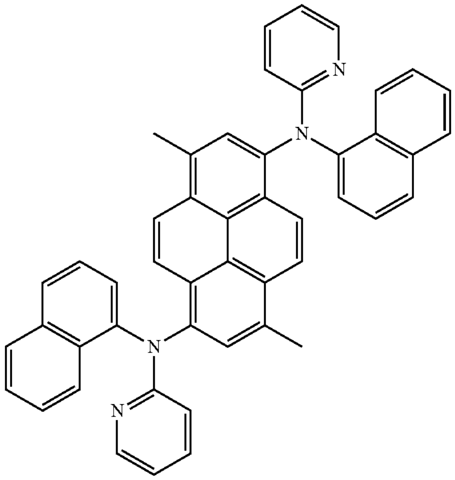

-continued
FD3
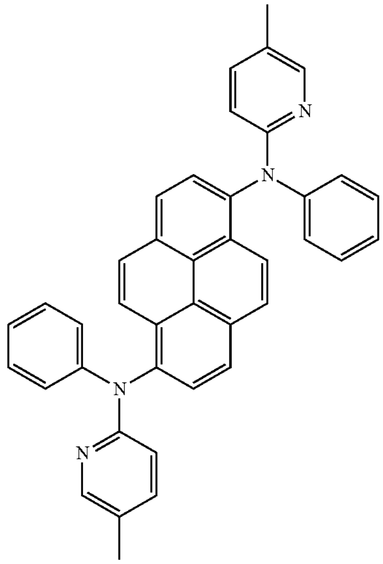
FD4
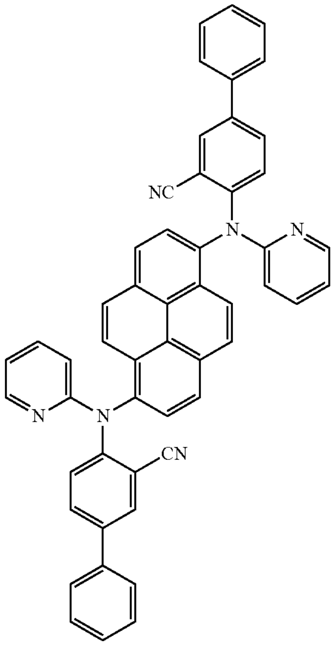
FD5
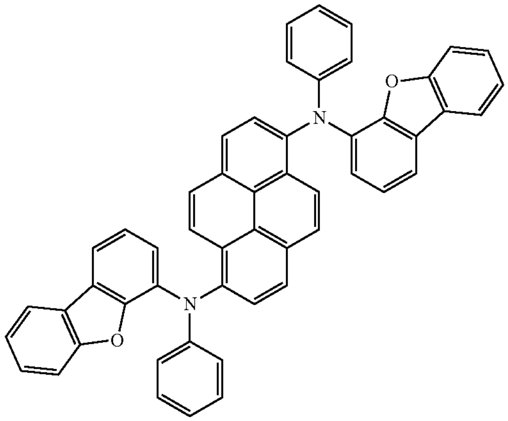
FD6
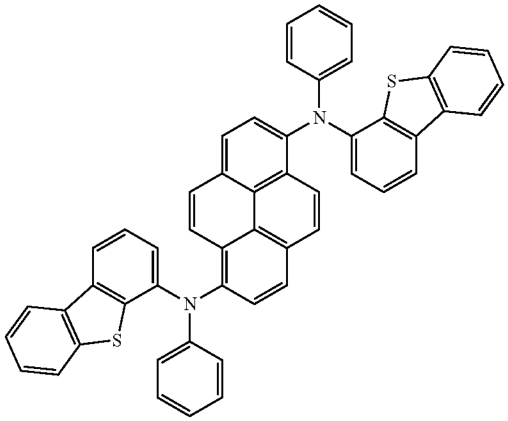
FD7
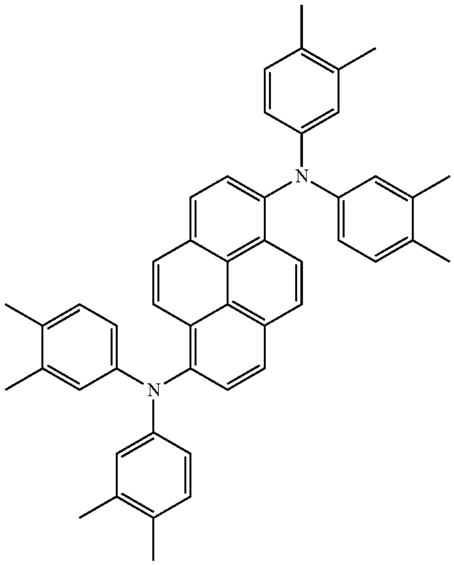
FD8
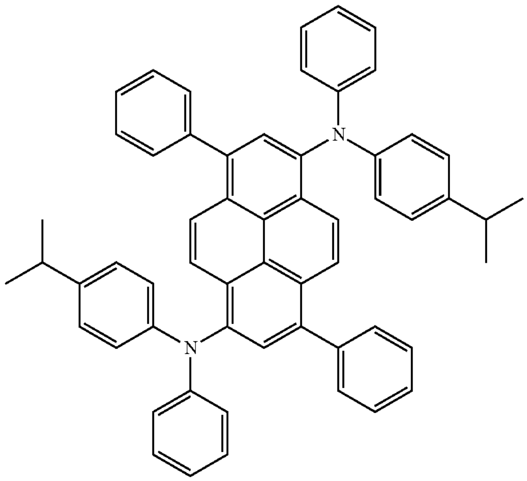

-continued
FD9
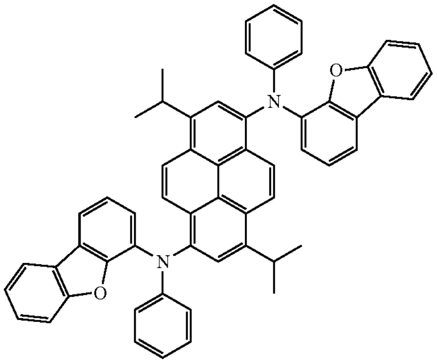
FD10
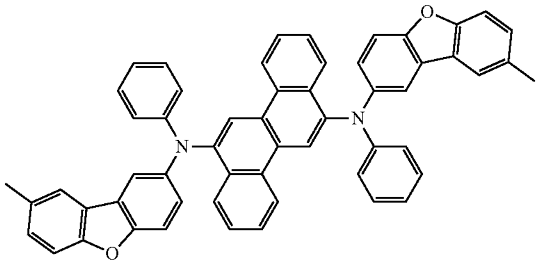
FD11
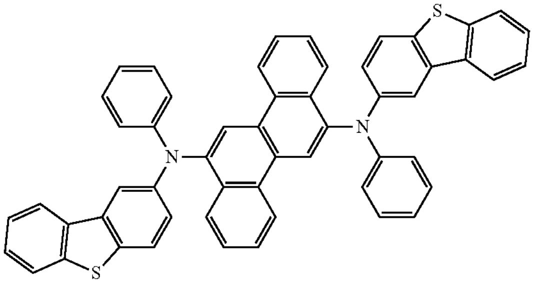
FD12
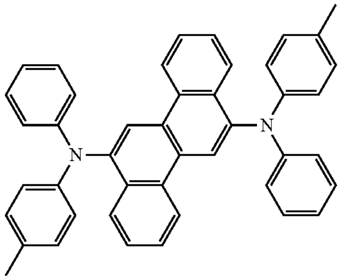
FD13
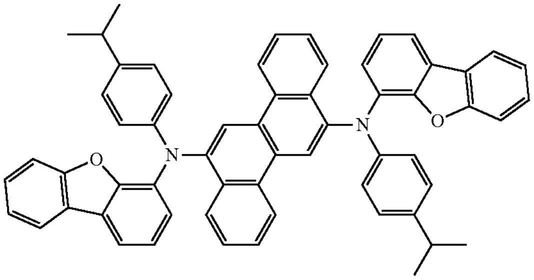
FD14
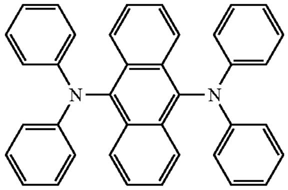
FD15
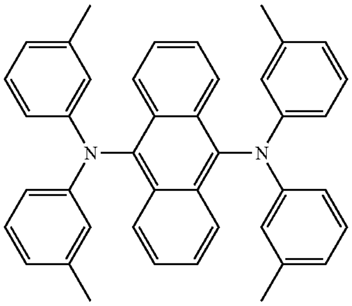
FD16
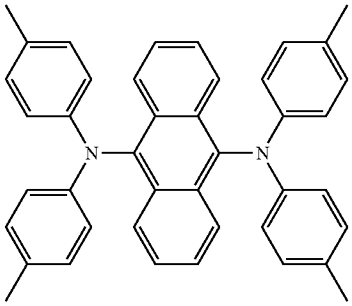

-continued
FD17
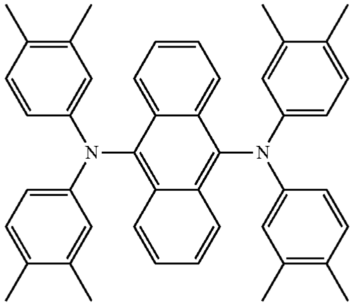
FD18
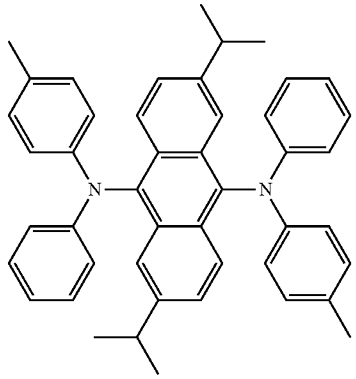
FD19
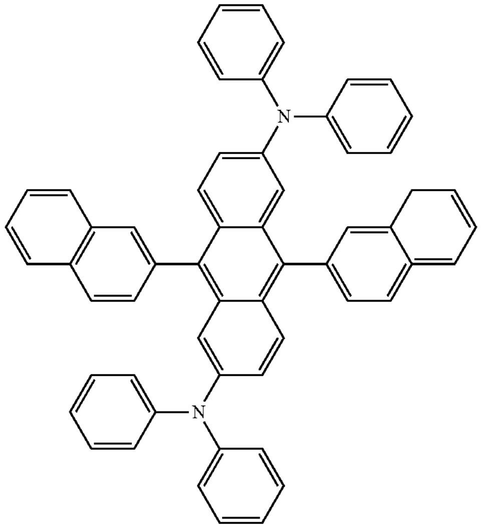
FD20
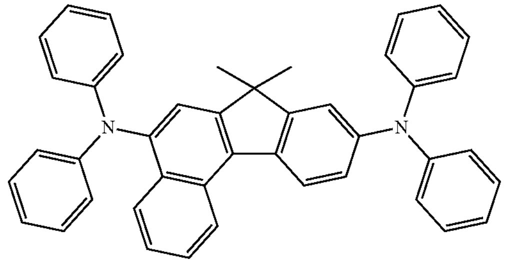
FD21
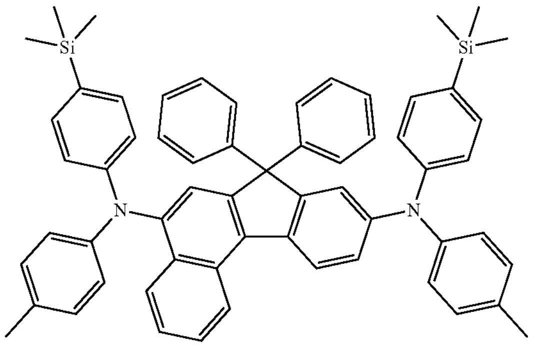
FD22
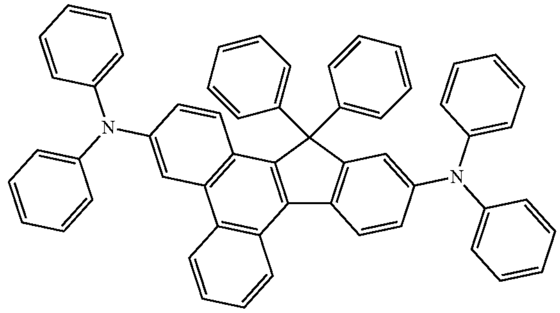
FD23
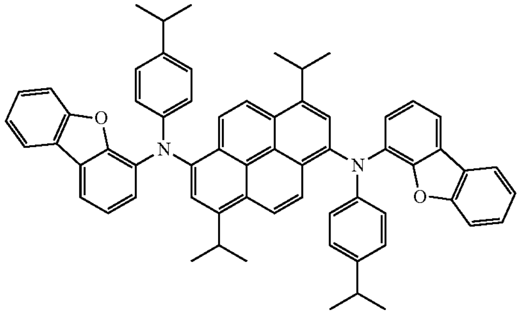
FD24
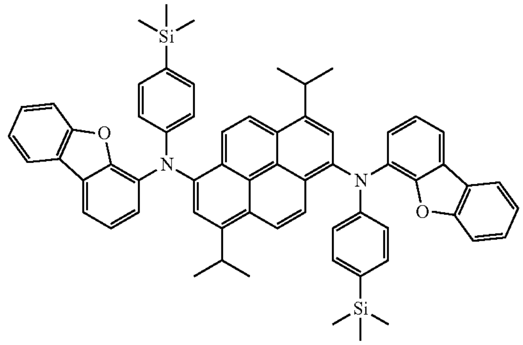

-continued
FD25
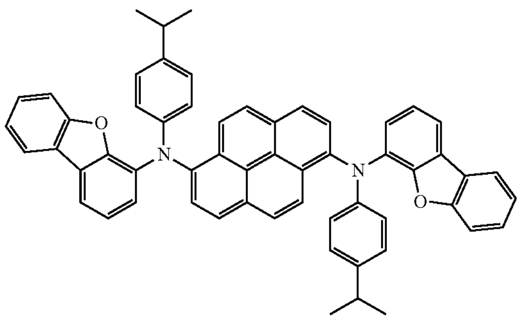
FD26
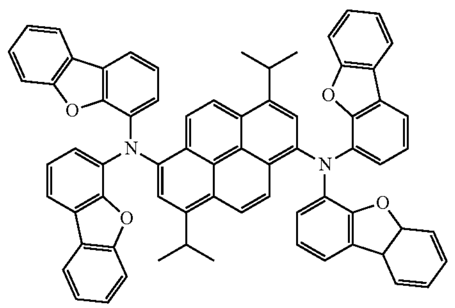
FD27
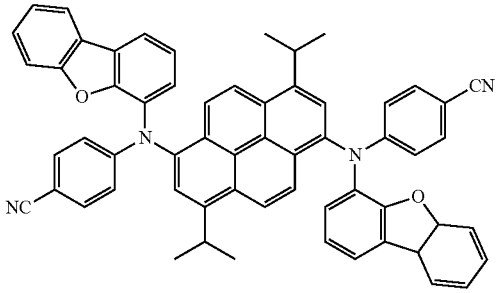
FD28
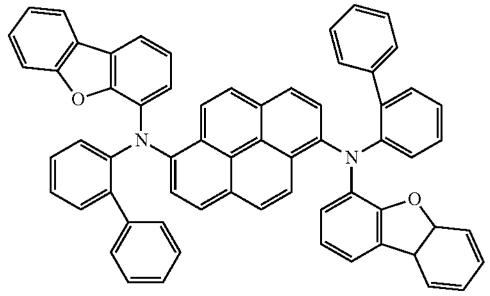
FD29
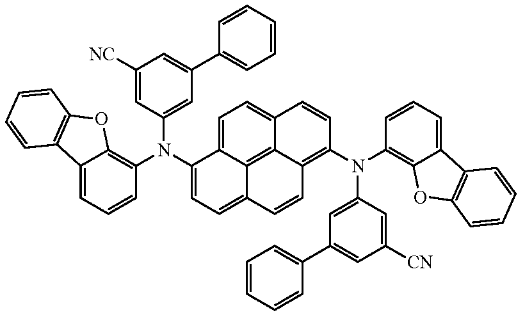
FD30
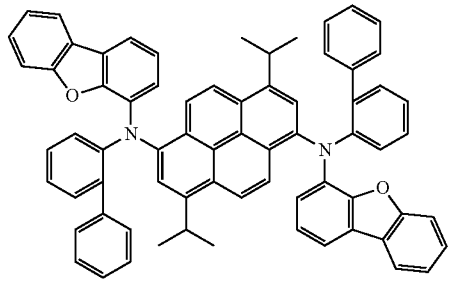
FD31
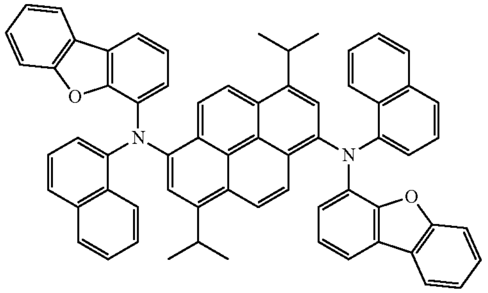
FD32
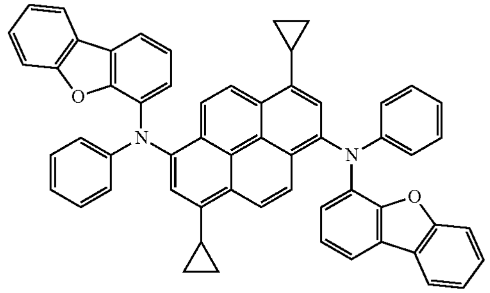
FD33
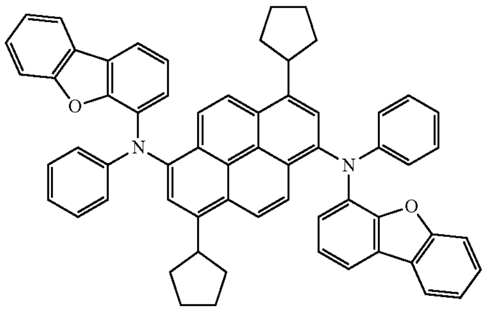
FD34
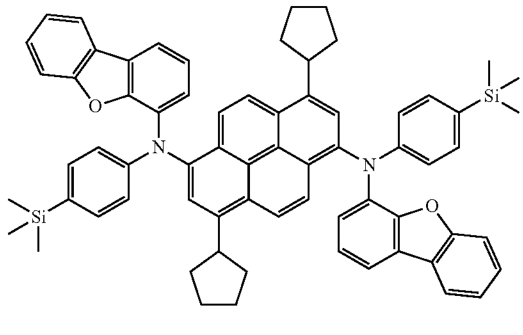

-continued

FD35

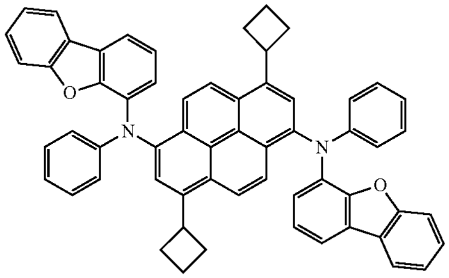

FD36

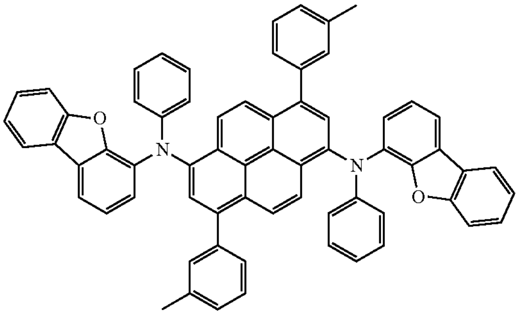

DPVBi

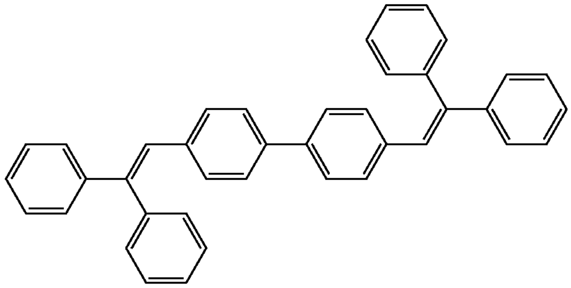

DPAVBi

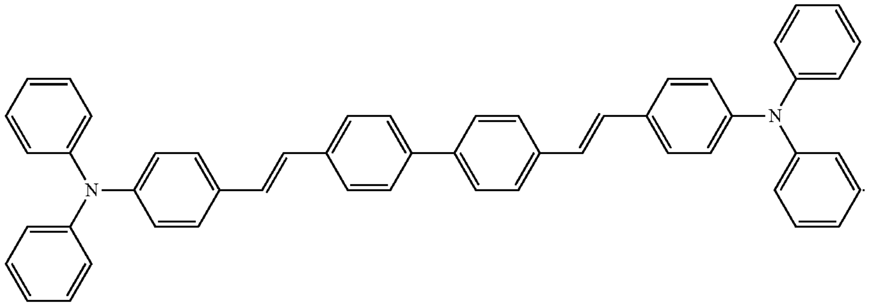

Delayed Fluorescence Material

The emission layer 133 may include a delayed fluorescence material.

In the present specification, the delayed fluorescence material may be selected from compounds capable of emitting delayed fluorescent light based on a delayed fluorescence emission mechanism.

The delayed fluorescence material included in the emission layer 133 may act as a host or a dopant depending on the type or kind of other materials included in the emission layer 133.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In some embodiments, the delayed fluorescence material may include: i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and/or ii) a material including a $C_8$-$C_{60}$ polycyclic group in which two or more cyclic groups are condensed to each other and sharing boron (B).

Examples of the delayed fluorescence material may include at least one of the following compounds DF1 to DF9:

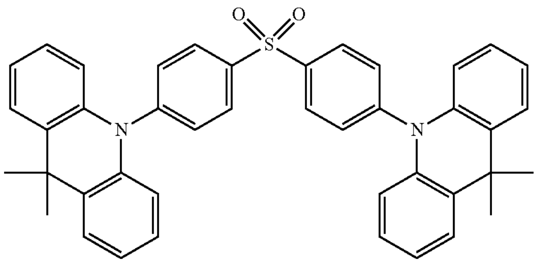

DF1(DMAC-DPS)

-continued
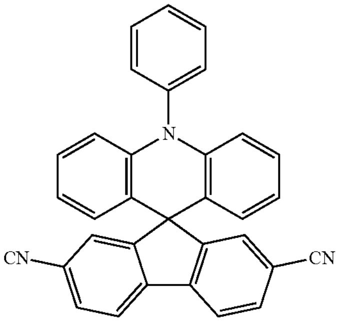
DF2(ACRFLCN)
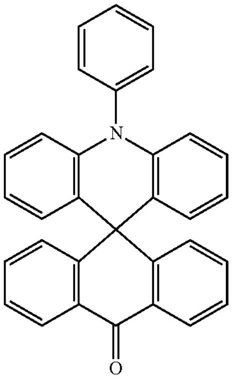
DF3(ACRSA)
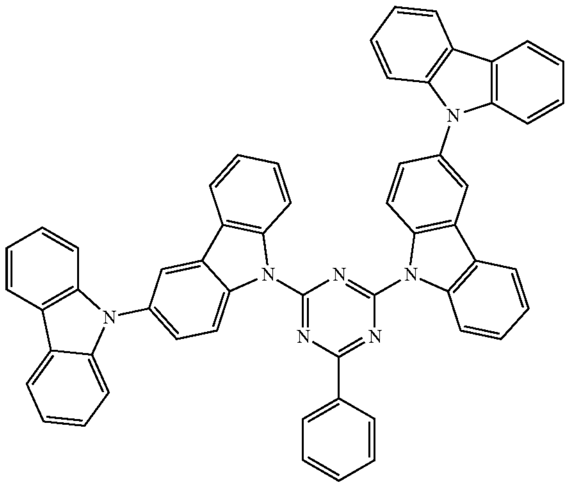
DF4(CC2TA)
-continued
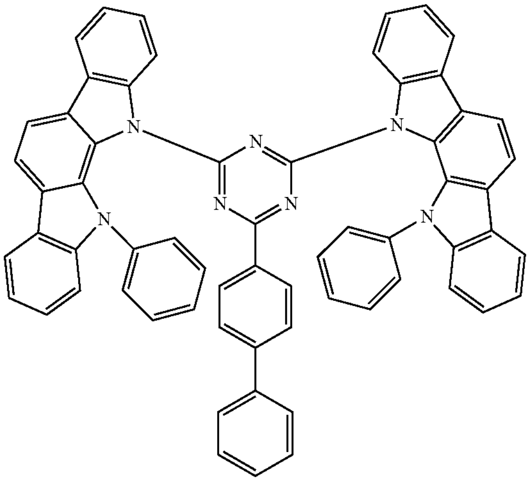
DF5(PIC-TRZ)
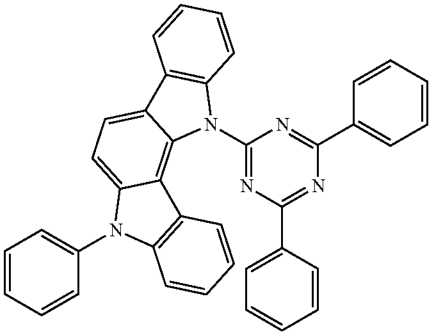
DF6(PIC-TRZ2)
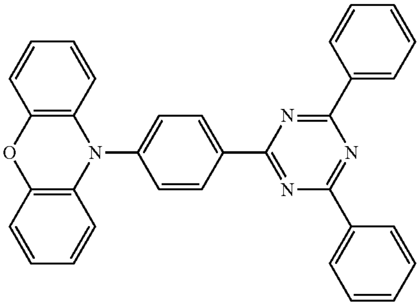
DF7(PXZ-TRZ)
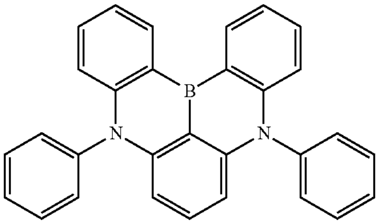
DF8(DABNA-1)

-continued

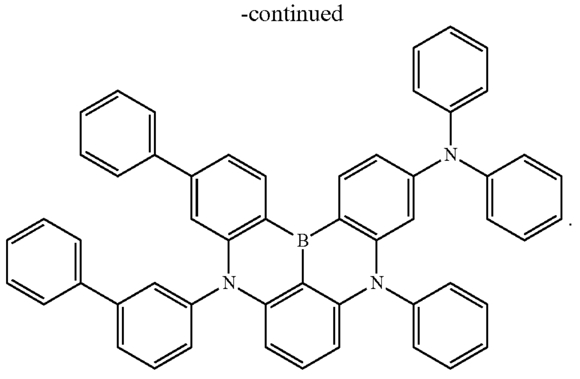

DF9(DABNA-2)

Quantum Dot

In one or more embodiments, the emission layer 133 may include a quantum dot. The quantum dot may be a light-emitting quantum dot. The emission layer 133 may further include a matrix material (for example, a polymer) in addition to quantum dots. For example, the emission layer 133 may include quantum dots and a matrix material, and the quantum dots may be dispersed in the matrix material.

The term "quantum dot" as utilized herein refers to a crystal of a semiconductor compound, and may include any suitable material capable of emitting light of one or more suitable emission wavelengths according to the size of the crystal.

The quantum dot may be synthesized by a wet chemical process, a metal organic (e.g., organometallic) chemical vapor deposition process, a molecular beam epitaxy process, or any process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled or selected through a process with a lower costs, and is easier than vapor deposition methods, such as metal organic chemical vapor deposition (MOCVD) and/or molecular beam epitaxy (MBE).

The quantum dot may include one or more Group III-VI semiconductor compounds; Group II-VI semiconductor compounds; Group III-V semiconductor compounds; Group I-III-VI semiconductor compounds; Group IV-VI semiconductor compounds; Group IV elements or compounds; or any combination thereof.

Examples of the Group II-VI semiconductor compound may include (e.g., may be) a binary compound, such as CdS, CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include (e.g., may be) a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. In some embodiments, the Group III-V semiconductor compound may further include a Group II element. Examples of the Groups III-V semiconductor compound further including a Group II element may include (e.g., may be) InZnP, InGaZnP, InAlZnP, etc.

Examples of the Group III-VI semiconductor compound may include (e.g., may be): a binary compound, such as GaS, GaSe, $Ga_2Se_3$, GaTe, InS, $In_2S_3$, InSe, $In_2Se_3$, and/or InTe; a ternary compound, such as $InGaS_3$ and/or $InGaSe_3$; or any combination thereof.

Examples of the Group I-III-VI semiconductor compound may include (e.g., may be): a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include (e.g., may be): a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

The Group IV element or compound may include (e.g., may be): a single element compound, such as Si and/or Ge; a binary compound, such as SiC and/or SiGe; or any combination thereof.

Each element included in a multi-element compound such as the binary compound, the ternary compound, and/or the quaternary compound may be present at a substantially uniform concentration or non-uniform concentration in a particle.

In an embodiment, the quantum dot may include a Group III-V semiconductor compound and/or a Group II-VI semiconductor compound.

In an embodiment, the quantum dot may include a fourth compound.

In an embodiment, the fourth compound may include an oxide, a chalcogenide, or any combination thereof.

Because the quantum dot of the present disclosure includes the fourth compound, an energy barrier for electron injection at an interface between the emission layer and the electron transport layer may be lowered, and thus the density of electrons recombining in the emission layer may be increased, thereby improving the efficiency and lifetime of the light-emitting device.

In an embodiment, the fourth compound may be an oxide of $A^4$, a chalcogenide of $A^4$, or any combination thereof.

$A_4$ may be a Group II element, a Group III element, or a combination thereof.

In an embodiment, $A_4$ may be zinc (Zn), magnesium (Mg), boron (B), aluminum (Al), gallium (Ga), indium (In), mercury (Hg), cadmium (Cd), thallium (Tl), or any combination thereof.

In an embodiment, the fourth compound may include $A_4$ and $A_{41}$, $A_4$ is the same as described herein, and $A_{41}$ may be oxygen (O), sulfur (S), selenium (Se), tellurium (Te), or any combination thereof.

In an embodiment, the fourth compound may include ZnO, ZnSe, ZnSeO, ZnSeS, ZnS, $Ga_2O_3$, $Ga_2S_3$, $Ga_2Se_3$, $Zn_zGa_{1-z}O$, $Zn_zGa_{1-z}S$, $Zn_zGa_{1-z}Se$, or any combination thereof, and z may be a real number satisfying the condition of $0<z<1$.

In an embodiment, the fourth compound may be identical to or different from a first compound or a second compound to be described later.

In an embodiment, the quantum dot may include the first compound and/or the second compound to be described later.

In some embodiments, the quantum dot may have a single structure in which the concentration of each element in the quantum dot is substantially uniform, or a core-shell dual structure (e.g., a core-shell structure). In some embodiments, in a quantum dot with the core-shell structure, the material included in the core and the material included in the shell may be different from each other.

The shell of the quantum dot may act as a protective layer that prevents or reduces chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

In an embodiment, the shell of the quantum dot may include the fourth compound. The fourth compound may be the same as described herein.

In an embodiment, the quantum dot may include a quantum dot core and the shell of the quantum dot covering the quantum dot core.

The shell of the quantum dot may include the fourth compound.

In an embodiment, the shell of the quantum dot may be single layered or multi-layered.

For example, the quantum dot may include a quantum dot core, a first shell of the quantum dot covering the quantum dot core, and a second shell of the quantum dot covering the first shell of the quantum dot, and at least one of the first shell of the quantum dot and the second shell of the quantum dot may include the fourth compound.

In an embodiment, the first shell of the quantum dot and the second shell of the quantum dot may both (e.g., simultaneously) include the fourth compound. In this case, the fourth compound included in the first shell of the quantum dot and fourth compound included the second shell of the quantum dot may be identical to or different from each other.

Examples of the shell of the quantum dot may include (e.g., may be) an oxide of a metal or a non-metal, a semiconductor compound, and any combination thereof. Examples of the oxide of metal or non-metal may include (e.g., may be) a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Examples of the semiconductor compound may include (e.g., may be), as described herein, a Group III-VI semiconductor compound; a Group II-VI semiconductor compounds; a Group III-V semiconductor compounds; a Group I-III-VI semiconductor compounds; a Group IV-VI semiconductor compounds; and any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of the emission wavelength spectrum of the quantum dot may be about 45 nm or less, for example, about 40 nm or less, or, about 30 nm or less, and within these ranges, color purity or color reproducibility may be increased. In some embodiments, because the light emitted through the quantum dot is emitted in all directions, the wide viewing angle may be improved.

In some embodiments, the quantum dot may be in the form of a spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having one or more suitable wavelength bands may be obtained from the quantum dot emission layer. Accordingly, by utilizing quantum dots of different sizes, a light-emitting device that emits light of one or more suitable wavelengths may be implemented. In one or more embodiments, the size of the quantum dot may be selected to emit red, green and/or blue light. In some embodiments, the size of the quantum dot may be configured to emit white light by combination of light of one or more suitable colors.

Electron Transport Layer 135

The interlayer 130 includes the electron transport layer 135 located between the emission layer 133 and the second electrode 150. The electron transport layer 135 may transfer the electrons injected from the second electrode 150 to the emission layer 133.

The electron transport layer 135 may include electron transporting particles.

In an embodiment, the electron transport layer 135 may include (e.g., consist of) a mixture of the electron transporting particles and an organic compound.

In an embodiment, the organic compound may be an electron transport compound.

Figure 2:
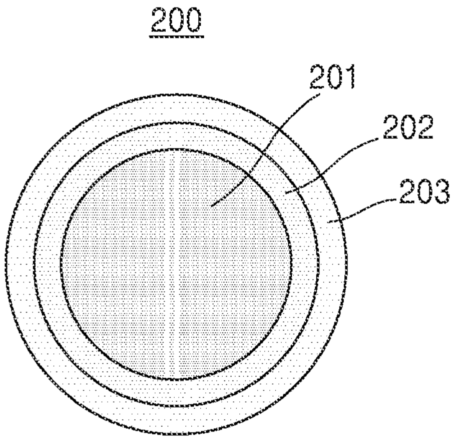
FIG. 2 shows a schematic cross-sectional view of an electron transporting particle according to an embodiment.

The cross section of an example of the electron transporting particle is shown in FIG. 2.

The electron transporting particle 200 of FIG. 2 may include a core 201, a first shell 202 covering the core 201, and a second shell 203 covering the first shell 202.

The core 201 may transport electrons injected from the second electrode 150 to the emission layer 133. The first shell 202 and the second shell 203 may act as a protective layer for preventing or reducing surface bonding of the core 201 and maintaining semiconductor characteristics and/or electron transport characteristics, and/or may also act as a charging layer for imparting electrophoretic characteristics to the electron transporting particle 200.

For example, because the electron transporting particle 200 of the present disclosure includes the first shell and the second shell, electron blocking may be reduced by lowering the surface defect density of the core, and because the second shell covering the first shell is further included, lattice defects and surface defects may be minimized or reduced, and thus the energy barrier for electron injection at the interface between the emission layer and the electron transport layer may be lowered, thereby increasing the density of electrons recombining at the emission layer.

The first shell 202 may include the first compound.

The first compound may include an oxide, a chalcogenide, or any combination thereof.

For example, the first compound may include oxygen (O), sulfur (S), selenium (Se), tellurium (Te), or any combination thereof.

In an embodiment, the first compound may include an oxide of $A^1$, a chalcogenide of $A^1$, or any combination thereof.

In an embodiment, $A^1$ may be a Group II element, a Group III element, or a combination thereof.

In an embodiment, $A^1$ may be zinc (Zn), magnesium (Mg), boron (B), aluminum (Al), gallium (Ga), indium (In), mercury (Hg), cadmium (Cd), thallium (Tl), or any combination thereof.

In an embodiment, the first compound may include $A^1$ and $A^{11}$, $A^1$ is the same as described herein, and $A^{11}$ may be oxygen (O), sulfur (S), selenium (Se), tellurium (Te), or any combination thereof.

In one or more embodiments, the first compound may include ZnO, ZnSe, ZnSeO, ZnSeS, ZnS, $Ga_2O_3$, $Ga_2S_3$, $Ga_2Se_3$, $Zn_xGa_{1-x}O$, $Zn_xGa_{1-x}S$, $Zn_xGa_{1-x}Se$, or any combination thereof, and x may be a real number satisfying the condition of $0<x<1$.

In an embodiment, the second compound may include an oxide, a chalcogenide, or any combination thereof.

For example, the second compound may include oxygen (O), sulfur (S), selenium (Se), tellurium (Te), or any combination thereof.

The second shell 203 may include the second compound.

In an embodiment, the second compound may include an oxide of $A^2$, a chalcogenide of $A^2$, or any combination thereof.

In an embodiment, $A^2$ may be a Group II element, a Group III element, or a combination thereof.

In an embodiment, $A^2$ may be zinc (Zn), magnesium (Mg), boron (B), aluminum (Al), gallium (Ga), indium (In), mercury (Hg), cadmium (Cd), thallium (Tl), or any combination thereof.

In an embodiment, the second compound may include $A^2$ and $A^{21}$, $A^2$ is the same as described herein, and $A^{21}$ may be oxygen (O), sulfur (S), selenium (Se), tellurium (Te), or any combination thereof.

In an embodiment, the second compound may include ZnO, ZnSe, ZnSeO, ZnSeS, ZnS, $Ga_2O_3$, $Ga_2S_3$, $Ga_2Se_3$, $Zn_yGa_{1-y}O$, $Zn_yGa_{1-y}S$, $Zn_yGa_{1-y}Se$, or any combination thereof, and y may be a real number satisfying the condition of $0<y<1$.

In an embodiment, $A^1$ of the first compound and $A^2$ of the second compound may be identical to or different from each other.

In an embodiment, $A^{11}$ of the first compound and $A^{21}$ of the second compound may be identical to or different from each other.

The core 201 may include a third compound.

The third compound and the first compound may be different from each other.

In an embodiment, the third compound and the second compound may be identical to or different from each other.

In an embodiment, the third compound may include an oxide, a chalcogenide, or any combination thereof.

For example, the third compound may include oxygen (O), sulfur (S), selenium (Se), tellurium (Te), or any combination thereof.

In an embodiment, the third compound may include an oxide of $A^3$, a chalcogenide of $A^3$, or any combination thereof.

In an embodiment, $A^3$ may be beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), iron (Fe), zinc (Zn), aluminum (Al), gallium (Ga), indium (In), silicon (Si), germanium (Ge), tin (Sn), copper (Cu), or any combination thereof.

In one or more embodiments, the third compound may include $A^3$ and $A^{31}$, $A^3$ is the same as described herein, and $A^{31}$ may be oxygen (O), sulfur (S), selenium (Se), tellurium (Te), or any combination thereof.

In one or more embodiments, the third compound may further include, in addition to the elements as described above, lithium (Li), sodium (Na), potassium (K), rubidium (Rb), cesium (Cs), beryllium (Be), or any combination thereof.

In one or more embodiments, the third compound may include $WO_3$, $TiO_2$, $MoO_3$, ZnO, ZnMgO, ZnAlO, ZrO, $Fe_2O_3$, $V_2O_5$, $Al_2O_3$, MgO, SnO, $SnO_2$, $Ta_2O_3$, $HfO_3$, $ZrSiO_4$, $BaTiO_3$, $BaZrO_3$, $WS_3$, $TiS_2$, $MoS_3$, ZnS, ZnMgS, ZnAlS, ZrS, $Fe_2S_3$, $V_2S_5$, $Al_2S_3$, $WSe_3$, $TiSe_2$, $MoSe_3$, ZnSe, ZnMgSe, ZnAlSe, ZrSe, $Fe_2Se_3$, $V_2Se_5$, $Al_2Se_3$, or any combination thereof.

In one or more embodiments, the third compound may include:

ZnO, ZnS, or ZnSe; or

ZnO, ZnS, or ZnSe, each further including Li, Na, K, Rb, Cs, Be, Mg, Ca, Sr, Ba, Cu, Al, Ga, In, Si, or any combination thereof.

In an embodiment, the first shell may include (e.g., consist of) the first compound.

In an embodiment, the second shell may include (e.g., consist of) the second compound.

In an embodiment, the core may include (e.g., consist of) the third compound.

In an embodiment, the average particle diameter (D50) of the electron transporting particle (i.e., the average diameter of the electron transporting particles (i.e., the electron transporting particle's average diameter)) may be from about 1 nm to about 30 nm, from about 3 nm to about 15 nm, from about 5 nm to about 12 nm, or from about 6 nm to about 10 nm. When the average particle diameter of the electron transporting particle satisfies the above-described ranges, the electron mobility and external light extraction efficiency of the electron transport layer 135 may be improved. The average diameter of the electron transporting particle (i.e., the electron transporting particle's average diameter) may be measured by utilizing dynamic light scattering (DLS) method (i.e., the average particle diameter may be, for example, a median diameter (D50) measured utilizing a laser diffraction particle diameter distribution meter).

A ratio between a radius of the core and a thickness of the first shell may be about 1:1 to 5:1 or 2:1 to 3:1.

A ratio between the thickness of the first shell and a thickness of the second shell may be about 0.5:1 to 3:1, 0.5:1 to 2:1, or 1:1 to 2:1.

In an embodiment, the weight of the first compound may be in a range of about 40 parts by weight to about 60 parts by weight based on 100 parts by weight of the electron transporting particle (i.e. in a range of 40 parts by weight to 60 parts by weight, 40 parts by weight to 55 parts by weight, or 40 parts by weight to 50 parts by weight).

In an embodiment, the weight of the second compound may be in a range of about 30 parts by weight to about 70 parts by weight based on 100 parts by weight of the electron transporting particle (i.e. in a range of 30 parts by weight to 70 parts by weight, 30 parts by weight to 65 parts by weight, 35 parts by weight to 70 parts by weight, 40 parts by weight to 60 parts by weight).

In an embodiment, the weight of the third compound may be in a range of about 20 parts by weight to about 80 parts by weight based on 100 parts by weight of the electron transporting particle (i.e. in a range of 20 parts by weight to 80 parts by weight, 20 parts by weight to 70 parts by weight, 30 parts by weight to 80 parts by weight, or 30 parts by weight to 70 parts by weight).

In an embodiment, the core may be in direct contact with the first shell.

In an embodiment, the first shell may be in direct contact with the second shell.

In an embodiment, a thickness of the electron transport layer 135 may be about 100 Å to about 1,500 Å, for example, about 150 Å to about 700 Å, or about 300 Å to about 600 Å.

When the thickness of the electron transport layer 135 is within the ranges described above, the electron transport layer may have satisfactory electron transport characteristics without a substantial increase in driving voltage.

In an embodiment, the electron transport layer 135 may be in direct contact with the second electrode 150.

In an embodiment, the electron transport layer 135 may be in direct contact with the emission layer 133.

Second Electrode 150

The second electrode 150 may be located above the interlayer 130, for example, above the electron transport layer 135. The second electrode 150 may be a cathode, which is an electron injection electrode, and as the material for the second electrode 150, a metal, an alloy, an electrically conductive compound, or any combination thereof, each having a relatively low-work function, may be utilized.

According to an embodiment, the second electrode 150 may include silver (Ag), aluminum (Al), magnesium (Mg), calcium (Ca), strontium (Sr), barium (Ba), indium (In), ytterbium (Yb), or any combination thereof.

In one embodiment, the second electrode 150 may include, in addition to, Ag, Al, Mg, Ca, Sr, Ba, In, or any combination thereof, an alkali metal, a rare earth metal, or any combination thereof.

The alkali metal may include Li, Na, K, Rb, Cs, or any combination thereof. The rare earth metal may include Sc, Y, Ce, Tb, Yb, Gd, or any combination thereof.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof.

The second electrode 150 may be a transmissive electrode, a semi-transmissive electrode, or a reflective electrode.

The second electrode 150 may have a single-layered structure or a multi-layered structure including a plurality of layers.

The second electrode 150 may be a transparent electrode, a semi-transparent electrode, or a reflective electrode.

For example, the second electrode 150 may be a transparent electrode that has a light transmittance of 50% or more (for example, 60% or more, 65% or more, 70% or more, 75% or more, 80% or more, 85% or more, 90% or more, or 95% or more) with respect to light having a visible-light wavelength range (for example, light having a maximum emission wavelength of about 400 nm to about 700 nm). As a result, the light-emitting device 10 utilizing the second electrode 150 may be a top emission type or kind light-emitting device having excellent or suitable emission efficiency and/or lifespan properties.

The second electrode 150 may have a single-layered structure (e.g., consisting of a single layer) or a multi-layered structure including a plurality of layers.

The thickness of the second electrode 150 may be, for example, from about 10 nm to about 1000 nm, or from about 100 nm to about 300 nm.

Capping Layer

A first capping layer may be located outside the first electrode 110 (e.g., on the side of the first electrode 110 facing oppositely away from the second electrode 150), and/or a second capping layer may be located outside the second electrode 150 (e.g., on the side of the second electrode 150 facing oppositely away from the first electrode 110). In one or embodiments, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in an emission layer of the interlayer 130 of the light-emitting device 10 may be extracted toward (e.g., emitted to) the outside through the first electrode 110 which is a semi-transmissive electrode or a transmissive electrode, and the first capping layer, or light generated in an emission layer of the interlayer 130 of the light-emitting device 10 may be extracted toward (e.g., emitted to) the outside through the second electrode 150 which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or a composite capping layer including an organic material and an inorganic material.

At least one of the first capping layer or the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. Optionally, the carbocyclic compound, the heterocyclic compound, and the amine group-containing compound may be substituted with a substituent including O, N, S, Se, Si, F, Cl, Br, I, or any combination thereof. In one or more embodiments, at least one of the first capping layer or the second capping layer may each independently include an amine group-containing compound.

For example, at least one of the first capping layer or the second capping layer may each independently include a compound represented by Formula 201, a compound represented by Formula 202, or any combination thereof.

In one or more embodiments, at least one of the first capping layer or the second capping layer may each independently include one of Compounds HT28 to HT33, Compounds CP1 to CP6, p-NPB, or any combination thereof:

CP1

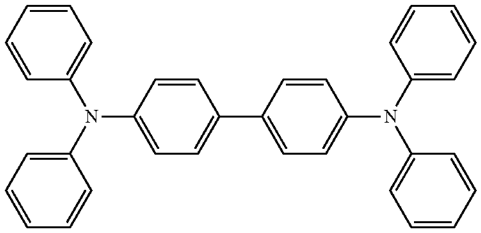

CP2

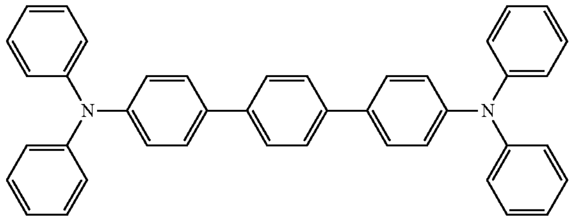

CP3

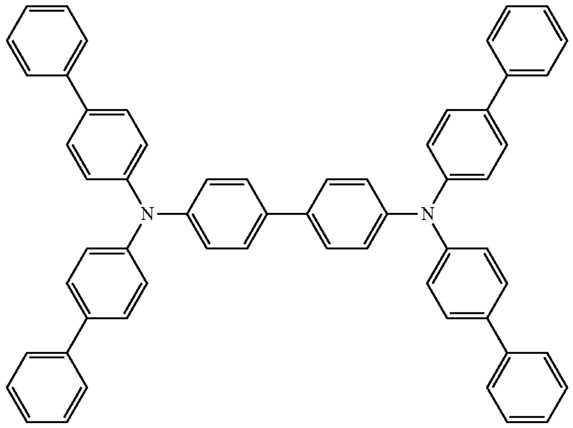

CP4

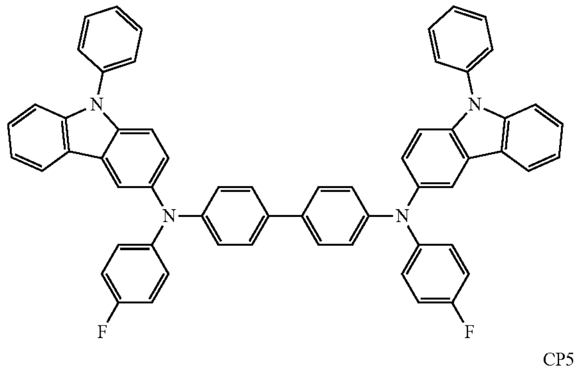

CP5

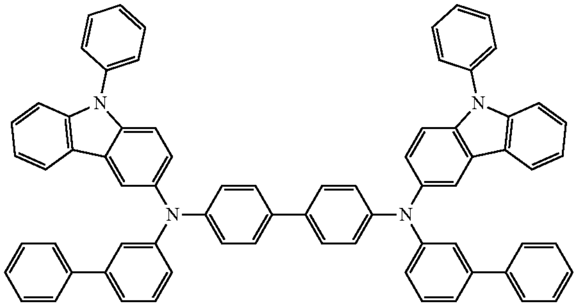

-continued

CP6

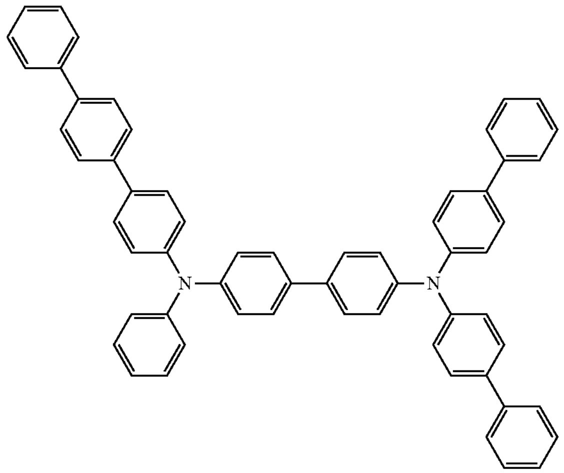

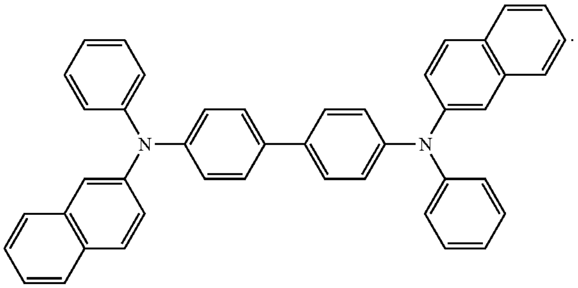

β-NPB

Electronic Apparatus

The light-emitting device may be included in one or more suitable electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light or white light. For details on the light-emitting device, related description provided above may be referred to. In one or more embodiments, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining film may be located among the plurality of subpixel areas to define each of the subpixel areas.

The color filter may further include a plurality of color filter areas and light-shielding patterns located among the plurality of color filter areas, and the color conversion layer may further include a plurality of color conversion areas and light-shielding patterns located among the plurality of color conversion areas.

The plurality of color filter areas (or the plurality of color conversion areas) may include a first area emitting a first color light, a second area emitting a second color light, and/or a third area emitting a third color light, wherein the first color light, the second color light, and/or the third color light may have different maximum emission wavelengths from one another. For example, the first color light may be red light, the second color light may be green light, and the third color light may be blue light. For example, the plurality of color filter areas (or the plurality of color conversion areas) may include quantum dots. In an embodiment, the first area may include a red quantum dot, the second area may include a green quantum dot, and the third area may not include (e.g., may exclude) a quantum dot. For details on the quantum dot, related descriptions provided herein may be referred to. The first area, the second area, and/or the third area may each include a scatter.

In one or more embodiments, the light-emitting device may be to emit a first light, the first area may be to absorb the first light to emit a first-first color light, the second area may be to absorb the first light to emit a second-first color light, and the third area may be to absorb the first light to emit a third-first color light. In this regard, the first-first color light, the second-first color light, and the third-first color light may have different maximum emission wavelengths. In particular, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be located between the color conversion layer and/or color filter and the light-emitting device. The sealing portion allows light from the light-emitting device to be extracted to the outside, and concurrently (e.g., simultaneously) prevents or substantially prevents ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the usage of the electronic apparatus. Examples of the functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device as described above, a biometric information collector.

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, one or more suitable measuring instruments, meters (for example, meters for a vehicle, an aircraft, and/or a vessel), projectors, and/or the like.

Figure 3:
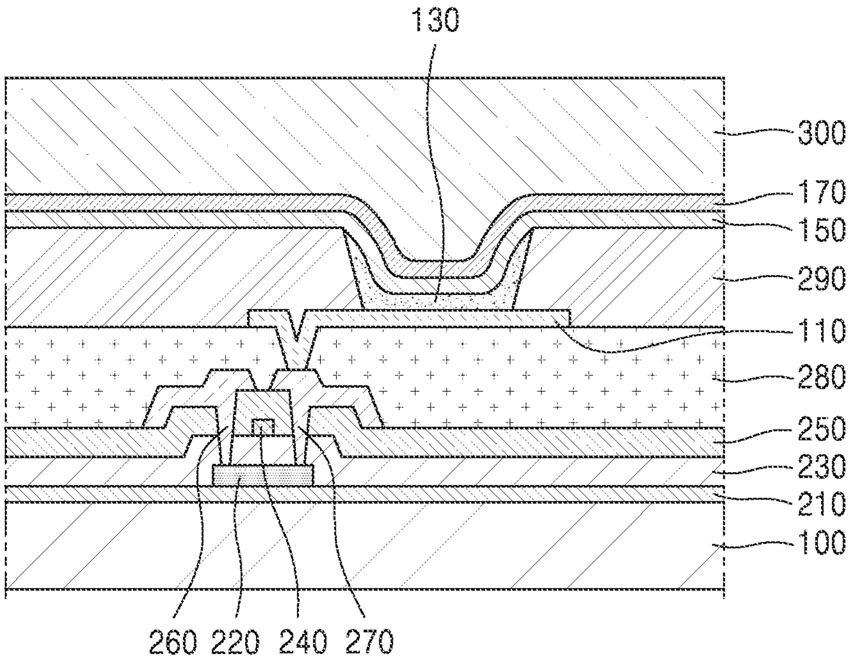
FIG. 3 shows a schematic cross-sectional view of the structure of an electronic apparatus according to an embodiment.
Figure 4:
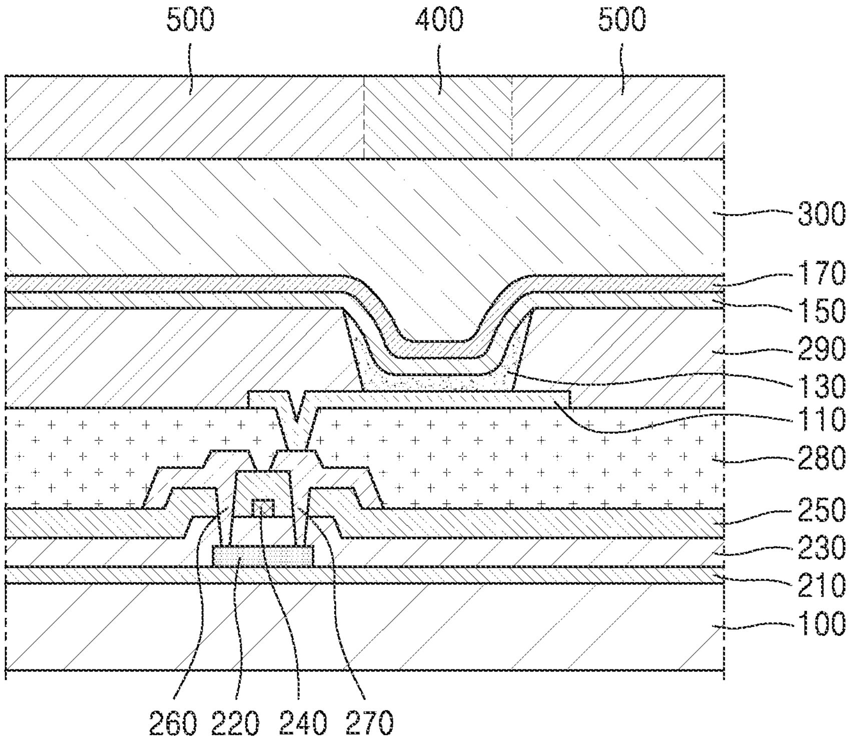
FIG. 4 shows a schematic cross-sectional view of the structure of an electronic apparatus according to an embodiment.

Description of FIGS. 3 and 4

FIG. 3 is a cross-sectional view showing a light-emitting apparatus according to an embodiment.

The light-emitting apparatus of FIG. 3 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be located on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may be located to not fully covering the drain electrode 270 and to expose a portion of the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and an interlayer 130 may be formed in the exposed region of the first electrode 110. The pixel defining layer 290 may be a polyimide or polyacrylic organic film. In one embodiment, one or more layers of the interlayer 130 may extend beyond the upper portion of the pixel defining layer 290 and may thus be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic film and the organic film.

FIG. 4 is a cross-sectional view showing a light-emitting apparatus according to an embodiment of the present disclosure.

The light-emitting apparatus of FIG. 4 is the same as the light-emitting apparatus of FIG. 3, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 4 may be a tandem light-emitting device.

Definition of Terms

The term "$C_3$-$C_{60}$ carbocyclic group" as used herein refers to a cyclic group consisting of only carbon atoms as ring-forming atoms and having three to sixty carbon atoms, and the term "$C_1$-$C_{60}$ heterocyclic group" as used herein refers to a cyclic group that has, in addition to one to sixty carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a T1 group or ii) a condensed cyclic group in which two or more T1 groups are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which two or more T2 groups are condensed with each other, or iii) a condensed cyclic group in which at least one T2 group and at least one T1 group are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a T1 group, ii) a condensed cyclic group in which two or more T1 groups are condensed with each other, iii) a T3 group, iv) a condensed cyclic group in which two or more T3 groups are condensed with each other, or v) a condensed cyclic group in which at least one T3 group and at least one T1 group are condensed with each other (for example, the π electron-rich $C_3$-$C_{60}$ cyclic group may be the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a T4 group, ii) a condensed cyclic group in which two or more T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein each refer to a group condensed to any cyclic group, a monovalent group, or a polyvalent group (for example, a divalent group, a trivalent group, a tetravalent group, etc.) according to the structure of a formula for which the corresponding term is used. For example, the "benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_6$ heterocyclic group may include (e.g., may be) a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include (e.g., may be) a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include (e.g., may be) a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at a terminal end (e.g., the terminus) of the $C_2$-$C_{60}$ alkyl group, and examples thereof may include (e.g., may be) an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at a terminal end (e.g., the terminus) of the $C_2$-$C_{60}$ alkyl group, and examples thereof may include (e.g., may be) an ethynyl group, a propynyl group, and the like. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include (e.g., may be) a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include (e.g., may be) a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group that includes, in addition to 1 to 10 carbon atoms, at least one heteroatom, as ring-forming atoms, and examples may include (e.g., may be) a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and examples thereof may include (e.g., may be) a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that includes, in addition to 1 to 10 carbon atoms, at least one heteroatom, as ring-forming atoms, and at least one carbon-carbon double bond in the cyclic structure thereof. Examples of the $C_1$-$C_{10}$ heterocycloalkenyl group may include (e.g., may be) a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group may include (e.g., may be) a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system that includes, in addition to 1 to 60 carbon atoms, at least one heteroatom, as ring-forming atoms. The term "$C_1$-$C_{60}$ heteroarylene group" as used herein refers to a divalent group having a heterocyclic aromatic system that includes, in addition to 1 to 60 carbon atoms, at least one heteroatom, as ring-forming atoms. Examples of the $C_1$-$C_6$ heteroaryl group may include (e.g., may be) a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiofuranyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its entire molecular structure (e.g., is not aromatic when considered as a whole). Examples of the monovalent non-aromatic condensed polycyclic group may include (e.g., may be) an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having substantially the same structure as the monovalent non-aromatic condensed polycyclic group described above.

The term "monovalent non-aromatic condensed heteropolycyclic group" as used herein refers to a monovalent group having two or more rings condensed to each other, at least one heteroatom in addition to carbon atom(s) (for example, having 1 to 60 carbon atoms), as ring-forming atoms, and non-aromaticity in its entire molecular structure (e.g., is not aromatic when considered as a whole). Examples of the monovalent non-aromatic condensed heteropolycyclic group may include (e.g., may be) a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, an azaadamantyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group described above.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$R_{10a}$" as used herein refers to:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include (e.g., may be) O, S, N, P, Si, B, Ge, Se, and any combinations thereof.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, compounds according to embodiments and light-emitting devices according to embodiments will be described in more detail with reference to the following synthesis examples and examples. The wording "B was utilized instead of A" used in describing Synthesis Examples refers to that an identical molar equivalent of B was utilized in place of A.

EXAMPLES

Synthesis Example 1: Synthesis of Electron Transporting Particle 1 (ZnO/ZnSeS/ZnS)

Synthesis of Core 0.5 g of zinc acetate dihydrate ($Zn(CH_3COO)_2 \cdot 2H_2O$) was added to 50 mL of distilled water in a 50 mL three-necked flask and strongly stirred. Then, NaOH solution having a concentration of 1 M was added thereto, was reacted for two hours at a temperature of 25° C., and the reaction was completed. The resulting mixture was purified twice with distilled water and acetone to obtain precipitated ZnO nanoparticles.

Synthesis of First Shell 0.3 g of the ZnO nanoparticles obtained above were dispersed in 50 mL of isopropanol (IPA) for 10 minutes utilizing ultrasonication. Then ammonium hydroxide was slowly added dropwise thereto so that the pH of the mixture becomes 10, $Na_2S$ and $Na_2Se$ solutions were slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnO/ZnSeS nanoparticles.

Synthesis of Electron Transporting Particle 1

0.3 g of the ZnO/ZnSeS nanoparticles obtained above were dispersed in 50 mL of IPA for 10 minutes utilizing ultrasonication. Then ammonium hydroxide was slowly added dropwise thereto so that the pH of the mixture becomes 10, $Na_2S$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnO/ZnSeS/ZnS nanoparticles.

Synthesis Example 2: Synthesis of Electron Transporting Particle 2 (ZnMgO/ZnSeS/ZnS)

Synthesis of Core 0.5 g of $Zn(CH_3COO)_2 \cdot 2H_2O$ and 0.1 g of magnesium acetate tetrahydrate was added to 50 mL of distilled water in a 50 mL three-necked flask and strongly stirred. Then, NaOH solution having a concentration of 1 M was added thereto, was reacted for two hours at a temperature of 25° C., and the reaction was completed. The resulting mixture was purified twice with distilled water and acetone to obtain precipitated ZnMgO nanoparticles.

Synthesis of First Shell 0.3 g of the ZnMgO nanoparticles obtained above were dispersed in 50 mL of IPA for 10 minutes utilizing ultrasonication. Then ammonium hydroxide was slowly added dropwise thereto so that the pH of the mixture becomes 10, $Na_2S$ and $Na_2Se$ solutions were slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnMgO/ZnSeS nanoparticles.

Synthesis of Electron Transporting Particle 2

0.3 g of the ZnMgO/ZnSeS nanoparticles obtained above were dispersed in 50 mL of IPA for 10 minutes utilizing ultrasonication. Then ammonium hydroxide was slowly added dropwise thereto so that the pH of the mixture becomes 10, $Na_2S$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnMgO/ZnSeS/ZnS nanoparticles.

Synthesis Example 3: Synthesis of Electron Transporting Particle 3 (ZnO/ZnSe/ZnS)

Synthesis of Core 0.5 g of $Zn(CH_3COO)_2 \cdot 2H_2O$ was added to 50 mL of distilled water in a 50 mL three-necked flask and strongly stirred. Then, NaOH solution having a concentration of 1 M was added thereto, was reacted for two hours at a temperature of 25° C., and the reaction was completed. The resulting mixture was purified twice with distilled water and acetone to obtain precipitated ZnO nanoparticles.

Synthesis of First Shell 0.3 g of the ZnO nanoparticles obtained above were dispersed in 50 mL of IPA for 10 minutes utilizing ultrasonication. Then ammonium hydroxide was slowly added dropwise thereto so that the pH of the mixture becomes 10, $Na_2Se$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnO/ZnSe nanoparticles.

Synthesis of Electron Transporting Particle 3

0.3 g of the ZnO/ZnSe nanoparticles obtained above were dispersed in 50 mL of IPA for 10 minutes utilizing ultrasonication. Then ammonium hydroxide was slowly added dropwise thereto so that the pH of the mixture becomes 10, $Na_2S$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnO/ZnSe/ZnS nanoparticles.

Synthesis Example 4: Synthesis of Electron Transporting Particle 4 (ZnMgO/ZnSe/ZnS)

Synthesis of Core 0.5 g of $Zn(CH_3COO)_2 \cdot 2H_2O$ and 0.1 g of magnesium acetate tetrahydrate were added to 50 mL of distilled water in a 50 mL three-necked flask and strongly stirred. Then, NaOH solution having a concentration of 1 M was added thereto, was reacted for two hours at a temperature of 25° C., and the reaction was completed. The resulting mixture was purified twice with distilled water and acetone to obtain precipitated ZnMgO nanoparticles.

Synthesis of First Shell 0.3 g of the ZnMgO nanoparticles obtained above were dispersed in 50 mL of IPA for 10 minutes utilizing ultrasonication. Then ammonium hydroxide was slowly added dropwise thereto so that the pH of the mixture becomes 10, $Na_2Se$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnMgO/ZnSe nanoparticles.

Synthesis of Electron Transporting Particle 4

0.3 g of the ZnMgO/ZnSe nanoparticles obtained above were dispersed in 50 mL of IPA for 10 minutes utilizing ultrasonication. Then ammonium hydroxide was slowly added dropwise thereto so that the pH of the mixture becomes 10, $Na_2S$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnMgO/ZnSe/ZnS nanoparticles.

Synthesis Example 5: Synthesis of Electron Transporting Particle a (ZnO/ZnS)

Synthesis of Core 0.5 g of $Zn(CH_3COO)_2 \cdot 2H_2O$ was added to 50 mL of distilled water in a 50 mL three-necked flask and strongly stirred. Then, NaOH solution having a concentration of 1 M was added thereto, was reacted for two hours at a temperature of 25° C., and the reaction was completed. The resulting mixture was purified twice with distilled water and acetone to obtain precipitated ZnO nanoparticles.

Synthesis of Electron Transporting Particle A 0.3 g of the ZnO nanoparticles obtained above were dispersed in 50 mL of IPA for 10 minutes utilizing ultrasonication. Then ammonium hydroxide was slowly added dropwise thereto so that the pH of the mixture becomes 10, $Na_2S$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnO/ZnS nanoparticles.

Synthesis Example 6: Synthesis of Electron Transporting Particle B (ZnMgO/ZnS)

Synthesis of Core 0.5 g of $Zn(CH_3COO)_2 \cdot 2H_2O$ and 0.1 g of magnesium acetate tetrahydrate were added to 50 mL of distilled water in a 50 mL three-necked flask and strongly stirred. Then, NaOH solution having a concentration of 1 M was added thereto, was reacted for two hours at a temperature of 25° C., and the reaction was completed. The resulting mixture was purified twice with distilled water and acetone to obtain precipitated ZnMgO nanoparticles.

Synthesis of Electron Transporting Particle B 0.3 g of the ZnMgO nanoparticles obtained above were dispersed in 50 mL of IPA for 10 minutes utilizing ultrasonication. Then ammonium hydroxide was slowly added dropwise thereto so that the pH of the mixture becomes 10, $Na_2S$ solution was slowly added dropwise thereto, the temperature of the mixture was raised to 60° C., and the mixture was stirred for 2 hours. 0.05 M of $ZnCl_2$ solution was slowly added dropwise to the mixture, the mixture was stirred for 1 hour, and then the reaction was completed. The resulting mixture was purified twice with distilled water and acetone to obtain precipitated ZnMgO/ZnS nanoparticles.

TABLE 1

| Electron transporting particle | Core | Shell: First shell | Shell: Second shell | Average particle diameter (D50) of electron transporting particle (nm) |
|---|---|---|---|---|
| Electron transporting particle 1 | ZnO | ZnSeS | ZnS | 8.3 |
| Electron transporting particle 2 | ZnMgO | ZnSeS | ZnS | 8.1 |
| Electron transporting particle 3 | ZnO | ZnSe | ZnS | 7.3 |
| Electron transporting particle 4 | ZnMgO | ZnSe | ZnS | 7.5 |
| Electron transporting particle A | ZnO | ZnS | | 5.3 |
| Electron transporting particle B | ZnMgO | ZnS | | 5.6 |

Example 1

As an anode, a glass substrate with an ITO electrode deposited thereon was cut to a size of 50 mm×50 mm×0.7 mm, sonicated with isopropyl alcohol and pure water, each for 60 minutes, a vacuuming was performed thereon for 4 hours, and then was cleaned by irradiation of ultraviolet rays and exposure of ozone thereto for 30 minutes. Then, the glass substrate was provided to a vacuum deposition apparatus.

PEDOT/PSS was spin-coated on the ITO electrode and dried to form a hole injection layer having a thickness of 100 nm, and then, TFB was spin-coated on the hole injection layer to form a hole transport layer having a thickness of 40 nm.

A composition including InP/ZnSe/ZnS core-shell quantum dots (average particle diameter: 10 nm to 15 nm) was spin-coated on the hole transport layer at a coating speed of 3,000 rpm for 30 seconds, and then naturally dried for 5 minutes at room temperature, followed by drying at a temperature of 100° C. for 10 minutes to form an emission layer having a thickness of 20 nm.

A composition in which 0.1 g of electron transporting particle 1 is mixed with 10 mL of cyclohexylbenzene, was coated on the emission layer by utilizing an inkjet printer, and then, dried naturally to form an electron transport layer having a thickness of 48 nm, and then, Ag was deposited on the electron transport layer to form a cathode having a thickness of 150 nm, thereby completing the manufacture of a light-emitting device.

Examples 2 to 4 and Comparative Examples A and B

Light-emitting devices were manufactured in substantially the same manner as in Example 1, except that, in forming the electron transport layer, each of electron transporting particles 2 to 4, A, or B was utilized instead of electron transporting particle 1.

Evaluation Example 1: Performance Evaluation of Light-Emitting Device

For the light-emitting devices manufactured in Examples 1 to 4 and Comparative Examples A and B, driving voltage (V) at a current density of 210 $mA/cm^2$ and luminescence efficiency (cd/A) were each measured utilizing a Keithley MU 236 and a luminance meter PR650, and results thereof are shown in Table 2.

TABLE 2

| | Electron transporting particles included in electron transport layer | Core | First shell | Second shell | Driving voltage (V) | Current density ($mA/cm^2$) | Luminescence efficiency (cd/A) |
|---|---|---|---|---|---|---|---|
| Example 1 | Electron transporting particle 1 | ZnO | ZnSeS | ZnS | 3.8 | 210 | 9.1 |
| Example 2 | Electron transporting particle 2 | ZnMgO | ZnSeS | ZnS | 3.5 | 210 | 9.4 |
| Example 3 | Electron transporting particle 3 | ZnO | ZnSe | ZnS | 4.3 | 210 | 7.7 |
| Example 4 | Electron transporting particle 4 | ZnMgO | ZnSe | ZnS | 4.1 | 210 | 7.9 |

TABLE 2-continued

| | Electron transporting particles included in electron transport layer | Core | First shell | Second shell | Driving voltage (V) | Current density ($mA/cm^2$) | Luminescence efficiency (cd/A) |
|---|---|---|---|---|---|---|---|
| Comparative Example A | Electron transporting particle A | ZnO | | ZnS | 4.9 | 210 | 5.6 |
| Comparative Example B | Electron transporting particle B | ZnMgO | | ZnS | 4.7 | 210 | 5.8 |

Referring to Table 2, it can be seen that the light-emitting devices of Examples 1 to 4 each had relatively low driving voltage and improved luminescence efficiency, as compared with the light-emitting devices of Comparative Examples A and B.

According to an embodiment of the present disclosure, because the electron transporting particle includes both (e.g., simultaneously) the first shell and the second shell, the surface defect may be reduced or decreased, and the energy barrier of the electron injection may be lowered, thereby enabling the realization of a light-emitting device having lower driving voltage and improved luminescence efficiency characteristics.

The use of "may" when describing embodiments of the inventive concept refers to "one or more embodiments of the inventive concept."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device comprising:

a first electrode;

a second electrode facing the first electrode; and an interlayer between the first electrode and the second electrode, wherein the interlayer comprises an emission layer and an electron transport layer, the electron transport layer is between the emission layer and the second electrode, the electron transport layer comprises an electron transporting particle, the electron transporting particle comprises a core, a first shell covering the core, and a second shell covering the first shell, the first shell comprises a first compound, the second shell comprises a second compound, the core comprises a third compound, the first compound and the second compound each independently comprises an oxide, a chalcogenide, or any combination thereof, the first compound and the second compound are different from each other, the first compound and the third compound are different from each other, the emission layer comprises a host, a dopant, a delayed fluorescence material, a quantum dot, or any combination thereof, the quantum dot is configured to emit light, and the electron transporting particle is configured differently from the quantum dot to transport electron to the emission layer.

2. The light-emitting device of claim 1, wherein the first compound comprises an oxide of $A^1$, a chalcogenide of $A^1$, or any combination thereof, and $A^1$ is a Group II element, a Group III element, or a combination thereof.

3. The light-emitting device of claim 2, wherein $A^1$ is zinc (Zn), magnesium (Mg), boron (B), aluminum (Al), gallium (Ga), indium (In), mercury (Hg), cadmium (Cd), thallium (Tl), or any combination thereof.

4. The light-emitting device of claim 1, wherein the first compound comprises ZnO, ZnSe, ZnSeO, ZnSeS, ZnS, $Ga_2O_3$, $Ga_2S_3$, $Ga_2Se_3$, $Zn_xGa_{1-x}O$, $Zn_xGa_{1-x}S$, $Zn_xGa_{1-x}Se$, or any combination thereof, and x is a real number satisfying a condition of $0<x<1$.

5. The light-emitting device of claim 1, wherein the second compound comprises an oxide of $A^2$, a chalcogenide of $A^2$, or any combination thereof, and $A^2$ is a Group II element, a Group III element, or a combination thereof.

6. The light-emitting device of claim 5, wherein $A^2$ is zinc (Zn), magnesium (Mg), boron (B), aluminum (Al), gallium (Ga), indium (In), mercury (Hg), cadmium (Cd), thallium (Tl), or any combination thereof.

7. The light-emitting device of claim 1, wherein the second compound comprises ZnO, ZnSe, ZnSeO, ZnSeS, ZnS, $Ga_2O_3$, $Ga_2S_3$, $Ga_2Se_3$, $Zn_yGa_{1-y}O$, $Zn_yGa_{1-y}S$, $Zn_yGa_{1-y}Se$, or any combination thereof, and y is a real number satisfying a condition of $0<y<1$.

8. The light-emitting device of claim 1, wherein the third compound comprises an oxide, a chalcogenide, or any combination thereof.

9. The light-emitting device of claim 1, wherein the third compound comprises an oxide of $A^3$, a chalcogenide of $A^3$, or any combination thereof, and $A^3$ is beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), iron (Fe), zinc (Zn), aluminum (Al), gallium (Ga), indium (In), silicon (Si), germanium (Ge), tin (Sn), copper (Cu), or any combination thereof.

10. The light-emitting device of claim 1, wherein the third compound comprises $WO_3$, $TiO_2$, $MoO_3$, ZnO, ZnMgO, ZnAlO, ZrO, $Fe_2O_3$, $V_2O_5$, $Al_2O_3$, MgO, SnO, $SnO_2$, $Ta_2O_3$, $HfO_3$, $ZrSiO_4$, $BaTiO_3$, $BaZrO_3$, $WS_3$, $TiS_2$, $MoS_3$, ZnS, ZnMgS, ZnAlS, ZrS, $Fe_2S_3$, $V_2S_5$, $Al_2S_3$, $WSe_3$, $TiSe_2$, $MoSe_3$, ZnSe, ZnMgSe, ZnAlSe, ZrSe, $Fe_2Se_3$, $V_2Se_5$, $Al_2Se_3$, or any combination thereof.

11. The light-emitting device of claim 1, wherein the third compound comprises:

ZnO, ZnS or ZnSe; or

ZnO, ZnS, or ZnSe, each further comprising Li, Na, K, Rb, Cs, Be, Mg, Ca, Sr, Ba, Cu, Al, Ga, In, Si, or any combination thereof.

12. The light-emitting device of claim 1, wherein an average particle diameter of the electron transporting particle is from about 3 nm to about 15 nm.

13. The light-emitting device of claim 1, wherein the emission layer comprises a quantum dot.

14. The light-emitting device of claim 13, wherein the quantum dot comprises a fourth compound, and the fourth compound comprises an oxide, a chalcogenide, or any combination thereof.

15. The light-emitting device of claim 14, wherein the fourth compound comprises an oxide of $A^4$, a chalcogenide of $A^4$, or any combination thereof, and $A^4$ is a Group II element, a Group III element, or a combination thereof.

16. The light-emitting device of claim 14, wherein the quantum dot has a core-shell structure comprising a core and a shell, and the shell of the core-shell structure comprises the fourth compound.

17. The light-emitting device of claim 1, wherein the electron transport layer is in direct contact with the emission layer.

18. The light-emitting device of claim 1, wherein the electron transport layer is in direct contact with the second electrode.

19. An electronic apparatus comprising the light-emitting device of claim 1.

20. The electronic apparatus of claim 19, further comprising a thin-film transistor, wherein the thin-film transistor comprises a source electrode and a drain electrode, and the first electrode of the light-emitting device is electrically connected to the source electrode or the drain electrode of the thin-film transistor.

* * * * *